(12) United States Patent
Yamamoto et al.

(10) Patent No.: US 7,755,941 B2
(45) Date of Patent: Jul. 13, 2010

(54) NONVOLATILE SEMICONDUCTOR MEMORY DEVICE

(75) Inventors: Yasue Yamamoto, Osaka (JP); Masanori Shirahama, Shiga (JP); Yasuhiro Agata, Osaka (JP); Toshiaki Kawasaki, Osaka (JP)

(73) Assignee: Panasonic Corporation, Osaka (JP)

( * ) Notice: Subject to any disclaimer, the term of this patent is extended or adjusted under 35 U.S.C. 154(b) by 137 days.

(21) Appl. No.: 11/971,334

(22) Filed: Jan. 9, 2008

(65) Prior Publication Data
US 2008/0205144 A1  Aug. 28, 2008

(30) Foreign Application Priority Data
Feb. 23, 2007 (JP) .............................. 2007-043496

(51) Int. Cl.
*G11C 16/04* (2006.01)

(52) U.S. Cl. .................. 365/185.05; 365/185.01; 365/185.11; 365/185.13; 365/185.14; 365/185.1; 365/185.17

(58) Field of Classification Search ............ 365/185.05, 365/185.01, 185.11, 185.13, 185.14, 185.17
See application file for complete search history.

(56) References Cited

U.S. PATENT DOCUMENTS

| | | | | |
|---|---|---|---|---|
| 4,288,863 A | * | 9/1981 | Adam .................... | 365/185.28 |
| 4,402,064 A | * | 8/1983 | Arakawa ................. | 365/185.1 |
| 5,097,444 A | * | 3/1992 | Fong ..................... | 365/185.12 |
| 5,301,150 A | | 4/1994 | Sullivan et al. | |
| 5,455,793 A | | 10/1995 | Amin et al. | |
| 6,038,171 A | * | 3/2000 | McElheny ............. | 365/185.14 |
| 6,191,980 B1 | | 2/2001 | Kelley et al. | |
| 6,295,226 B1 | * | 9/2001 | Yang ..................... | 365/185.01 |
| 7,239,558 B1 | * | 7/2007 | Poplevine et al. ........... | 365/188 |
| 7,339,825 B2 | * | 3/2008 | Iioka et al. ............. | 365/185.13 |
| 7,391,647 B2 | * | 6/2008 | Fang et al. ............. | 365/185.18 |
| 7,391,668 B2 | * | 6/2008 | Natori et al. ........... | 365/230.03 |
| 7,471,572 B1 | * | 12/2008 | Bu ........................ | 365/185.29 |
| 7,514,740 B2 | * | 4/2009 | Hsu et al. ................... | 257/316 |
| 7,515,478 B2 | * | 4/2009 | Li et al. .................. | 365/185.26 |
| 7,558,111 B2 | * | 7/2009 | Eftimie et al. .......... | 365/185.08 |
| 7,623,380 B2 | * | 11/2009 | Yamamoto et al. ........ | 365/185.1 |
| 7,646,638 B1 | * | 1/2010 | Bu ........................ | 365/185.05 |
| 7,671,401 B2 | * | 3/2010 | Fang et al. ................. | 257/318 |

FOREIGN PATENT DOCUMENTS

JP    2005-267794    9/2005

OTHER PUBLICATIONS

McPartland, R., et al., "1.25 Volt, Low Cost, Embedded FLASH Memory for Low Density Applications", 2000 Symposium on VLSI Circuits Digest of Technical Papers, pp. 158-161.

* cited by examiner

*Primary Examiner*—Viet Q Nguyen
(74) *Attorney, Agent, or Firm*—McDermott Will & Emery LLP

(57) ABSTRACT

In a nonvolatile semiconductor memory device storing data by accumulating charges in a floating gate, memory units, each of which includes a first MOS transistor as a read device, a bit cell composed of a first capacitor as a capacitance coupling device and a second capacitor as an erase device, and a decode device including a second MOS transistor and a third MOS transistor, are arranged in array. This attains nonvolatile memory capable of bit by bit selective erase arranged in array to thus reduce the core area remarkably.

7 Claims, 19 Drawing Sheets

FIG.7

| Common | | Standby | Read | Programming | Erase (T bit) | Erase (B bit) |
|---|---|---|---|---|---|---|
| | VPP | 3.3−Vt | 3.3−Vt | VPP | VPP | VPP |
| Selected | RG | 0V | VDD | 0V | 0V | 0V |
| | CG | 0V | VDD | VPP | 0V | 0V |
| | EG(T) | 0V | 0V | VPP | VPP | 0V |
| | EG(B) | 0V | 0V | VPP | 0V | VPP |
| Non-selected | RG | 0V | 0V | 0V | 0V | 0V |
| | CG | 0V | 0V | 0V | 0V | 0V |
| | EG(T) | 0V | 0V | 0V | 0V | 0V |
| | EG(B) | 0V | 0V | 0V | 0V | 0V |

|      | Programming | Erase | | Read | Standby |
|------|-------------|-------|-----|------|---------|
| DIN  | X           | "L"   | "H" | X    | X       |
| PROG | "H"         | "L"   | "L" | "L"  | "L"     |
| EGDT | "H"         | "H"   | "L" | X    | X       |
| EGDB | "H"         | "L"   | "H" | X    | X       |

X:DON'T CARE

|  | Programming | Erase | | | | Read | | Standby |
|---|---|---|---|---|---|---|---|---|
| PA⟨n⟩ | X | "H" | "H" | "L" | "L" | "H" | "L" | X |
| DIN | X | "L" | "H" | "L" | "H" | X | X | X |
| PROG | "H" | "L" | "L" | "L" | "L" | "L" | "L" | "L" |
| EGDT | "H" | "H" | "L" | "L" | "L" | X | X | X |
| EGDB | "H" | "L" | "H" | "L" | "L" | X | X | X |

X:DON'T CARE

NONVOLATILE SEMICONDUCTOR MEMORY DEVICE

BACKGROUND OF THE INVENTION

The present invention relates to nonvolatile semiconductor memory devices and particularly relates to area reduction of a nonvolatile semiconductor memory device including a nonvolatile memory element fabricated by a standard CMOS process.

Recently, a desire is grown that information typified by contents' encryption key is incorporated in a system LSI fabricated by a standard CMOS process. Utilization of a metal fuse for the incorporation has been examined, but apprehension about information leakage through analysis still remains. To tackle this problem, incorporation of a low-cost rewriteable nonvolatile memory device may be considered.

In the case where a nonvolatile semiconductor memory device, such as a flash memory or the like is incorporated in a system LSI, a dedicated process is required in addition to the standard CMOS process to thus increase the process cost, disabling application to an advanced process. In view of this, a low-cost nonvolatile semiconductor memory device is demanded which is capable of being embedded in an LSI fabricated by an advanced standard CMOS process.

To meet the above demand, a CMOS nonvolatile memory has been proposed which includes a floating gate formed of a single NMOS gate and two PMOS gates capable of being embedded in an LSI fabricated by the standard CMOS process and which uses a first PMOS diffusion layer region as a control gate during a programming operation and a read operation while using a second PMOS diffusion layer region during an erase operation (see Richard J. McPartland, et al., "1.25 Volt, Low Cost, Embedded FLASH Memory for Low Density Applications," 2000 Symposium on VLSI Circuits Digest of Technical Papers, pp. 158-161).

FIG. 22 is a circuit diagram of a conventional nonvolatile memory element composed of one NMOS transistor and two PMOS transistors. FIG. 23 is a sectional view of the conventional nonvolatile memory element shown in FIG. 22.

In FIG. 22, reference numeral 1 denotes a control gate transistor (PMOS transistor), 2 denotes an erase gate transistor (PMOS transistor), 3 denotes a read transistor (NMOS transistor), 4 denotes a control gate (CG), 5 denotes an erase gate (EG), 6 denotes a drain terminal of the NMOS transistor, 7 denotes a source terminal of the NMOS transistor, and 8 denotes a P-type silicon substrate terminal. Reference numeral 9 denotes a floating gate (FG) connecting the gates of the PMOS transistors 1, 2 and the gate of the NMOS transistor 3.

As shown in FIG. 23, the NMOS transistor 3 is formed on a P-type silicon substrate 10 and includes N-type conductive regions and a gate electrode. The PMOS transistors 1, 2 are formed on N-type wells 11, 12, respectively, in the P-type silicon substrate 10 and each includes P-type conductive regions and a gate electrode. The floating gate (FG) 9 connects the gate electrode of the NMOS transistor 3 and the gate electrodes of the PMOS transistors 1, 2. A write operation, a read operation, and an erase operation of carriers to or from the floating gate (FG) are performed by applying predetermined voltages to the respective terminals.

Referring to a core structure of the nonvolatile semiconductor memory device including a nonvolatile memory element capable of being fabricated by the standard CMOS process, a line configuration using a fuse is employed in which lines, of which number is equal to the number of bit cells, are serially connected, wherein each bit cell includes a sense amplifier, a latch circuit, and a shift register (see Japanese Patent Application Laid Open unexamined Publication No. 2005-267794).

The aforementioned nonvolatile semiconductor memory device capable of being fabricated by the standard CMOS process, however, assumes employment of a fuse, which has small capacity, and therefore, the line configuration should have been employed in which lines, of which number is equal to the number of bit cells, are serially connected, wherein each bit cell includes a sense amplifier, a latch circuit, and a shift register. Accordingly, implementation of a nonvolatile memory core having middle capacity of several kilobits results in an increase in core area.

SUMMARY OF THE INVENTION

To solve the above problems, the present invention provides a nonvolatile semiconductor memory device for storing data by accumulating charges in a floating gate, which includes memory units arranged in arrays and each including a first MOS transistor as a read device, a bit cell composed of a first capacitor as a capacitance coupling device and a second capacitor as an erase device, and second and third MOS transistors as a decode device, wherein the gate of the first MOS transistor and each one end of the first and second capacitors share a gate to form a floating gate, the source of the first MOS transistor is connected to a source line, the second MOS transistor is connected to the second capacitor, and the third MOS transistor is connected to the second capacitor. This attains array of the nonvolatile memories capable of bit by bit selective erase, thereby reducing the core area remarkably.

With the above memory array configuration, bit by bit selective erase is enabled, and the sense amplifier, the latch circuit, the level shifter, and the like can be shared, leading to remarkable reduction in memory core area.

A nonvolatile semiconductor memory device includes a plurality of memory units arranged in array and each including a read device, an erase device, and a decode device, each of which is composed of a MOS transistor, wherein in each of the memory units, the read device and the erase device are connected to each other, the read device and the erase device share a gate, and an output side of the decode device, which is controlled by a row selection signal and a column selection signal, is connected to the erase device. With this memory array configuration, bit by bit selective erase is attained, and more peripheral circuits can be shared when compared with the conventional one, leading to reduction in memory core area.

When the column selection signal of the decode device is generated from a program signal and a data signal, column selection per plural bits is enabled for plural-bit batch write, and column selection for bit by bit selective erase is enabled on the basis of a data signal. Thus, both plural-bit batch write and bit by bit selective erase can be attained.

When the column selection signal of the decode device is generated from an address signal, a data signal and a program signal, an arbitrary column line can be selected to attain bit by bit selective erase.

According to the nonvolatile semiconductor memory device, wherein the decode device is composed of a NAND circuit, bit by bit selective erase is enabled.

According to the nonvolatile semiconductor memory device, wherein a part under a drain of at least one MOS transistor of the decode device is subjected to well injection, the reliability of the decode device, to which high voltage is applied, is enhanced.

According to the nonvolatile semiconductor memory device which further includes a capacitance coupling device connected to the gate shared by read device and the erase device in each of the memory units, data can be programmed.

According to the nonvolatile semiconductor memory device, wherein a thickness of a gate oxide film of each MOS transistor composing the respective memory units is substantially equal to a thickness of a gate oxide film of a MOS transistor forming an input/output circuit of an LSI, though high voltage is used for data write, the reliability of the nonvolatile semiconductor memory device, which can be fabricated easily, increases with the gate breakdown voltage of the MOS transistors secured.

A nonvolatile semiconductor memory device is characterized by including: memory units arranged in array and including a first MOS transistor as a read device, a bit cell composed of a first capacitor as a capacitance coupling device and a second capacitor as an erase device, and second and third MOS transistors as a decode device, wherein a gate of the first MOS transistor and each one end of the first and second capacitors share a gate to form a floating gate, a source of the first MOS transistor is connected to a source line, the second MOS transistor is connected to the second capacitor, and the third MOS transistor is connected to the second capacitor. Accordingly, bit by bit selective erase is enabled.

The nonvolatile semiconductor memory device, wherein the first and second capacitors are each composed of a MOS transistor, can be fabricated by the CMOS process, which means that the nonvolatile semiconductor memory device can be fabricated easily.

The nonvolatile semiconductor memory device is characterized in that the first capacitor is composed of a MOS transistor formed in an N-type well region and including a source or a drain formed of a P-type diffusion layer, and the second capacitor is composed of a MOS transistor formed in an N-type well region and including a source or a drain formed of an N-type diffusion layer. This nonvolatile semiconductor memory device can be fabricated by the CMOS process and can perform data programming and erase.

The nonvolatile semiconductor memory device is characterized in that the first capacitor is composed of a MOS transistor formed in an N-type well region and including a source or a drain formed of a P-type diffusion layer, and the second capacitor is composed of a MOS transistor formed in an N-type well region and including a source or a drain formed of a P-type diffusion layer. This nonvolatile semiconductor memory device can be fabricated by the CMOS process and can perform data programming and erase.

The nonvolatile semiconductor memory device, which further includes a fourth MOS transistor in the bit cell, wherein a source of the fourth MOS transistor is connected to a drain of the first MOS transistor, includes a selection transistor to avoid disturbance in non-selected cells during read, thereby increasing the reliability of the nonvolatile memory.

According to the nonvolatile semiconductor memory device which further includes a logic gate to which a first control line arranged in a column direction and a second control line arranged in a row direction are input, the logic gate being connected to a gate of the third MOS transistor, a bit cell at an arbitrary address can be selected and erased.

According to the nonvolatile semiconductor memory device, wherein bias applied to the second control line is smaller than bias applied to a third control line connected to a gate of the second MOS transistor and arranged in the row direction, bit by bit selective erase is enabled with the reliability maintained.

The nonvolatile semiconductor memory device is characterized by further including fifth and sixth MOS transistors in each memory unit, wherein the fifth MOS transistor is connected to a source or a drain of a MOS transistor composing the second capacitor and to the second MOS transistor, and the sixth MOS transistor is connected to the source or the drain of the MOS transistor composing the second capacitor and to the third MOS transistor. In this nonvolatile semiconductor memory device, cascode connection of the MOS transistors relaxes the voltage applied between the gates and the drains of the MOS transistors to increase the reliability.

According to the nonvolatile semiconductor memory device, wherein a drain of the fourth MOS transistor is connected to an input side of an amplifier, current is allowed to flow in the read device according to the presence or absence of the charges in the floating gate and the potential of the bit lines is amplified by the amplifier to thus output data stored in the memory cell.

According to the nonvolatile semiconductor memory device, wherein the fifth MOS transistor is a PMOS transistor while the sixth MOS transistor is an NMOS transistor, transfer and discharge of high voltage (VPP) to the erase device necessary for bit by bit selective erase can be performed.

According to the nonvolatile semiconductor memory device, which farther includes a second bit cell composing a differential cell together with the bit cell as a first bit cell, wherein a drain of the fourth MOS transistor of each of the first bit cell and the second bit cell is connected to an input side of a differential amplifier, a nonvolatile memory can be attained which is capable of bit by bit selective erase and has excellent reliability in data retention.

When wells of MOS transistors composing the respective first capacitors of the first bit cell and the second bit cell are shared, the size of the memory core can be reduced.

According to the nonvolatile semiconductor memory device, wherein when data is read out from the first bit cell and the second bit cell, the same current load is connected to the differential amplifier, data of the differential bit cell can be read out stably.

In a nonvolatile semiconductor memory device, wherein a thickness of a gate oxide film of each MOS transistor composing the respective memory units is substantially equal to a thickness of a gate oxide film of a MOS transistor forming an input/output circuit of an LSI, when the MOS transistors fabricated by the same process as the process of fabricating a MOS transistor forming an input/output circuit of an LSI are used, a low-cost nonvolatile semiconductor memory device can be realized.

BRIEF DESCRIPTION OF THE DRAWINGS

FIG. 7 is a table listing examples of bias conditions that the bit cells must satisfy in Embodiment 1 of the present invention.

DETAILED DESCRIPTION OF THE INVENTION

Embodiments of the present invention will be described below with reference to the accompanying drawings. In the following embodiments, a first erase control signal line (EGDT) and a second erase control signal line (EGDB) are generated from a program signal and a data signal, and a first erase signal line (EGDTP) and a second erase signal line (EGDBP) are generated from a program signal, an erase signal, and a data signal.

Embodiment 1

Figure 1:
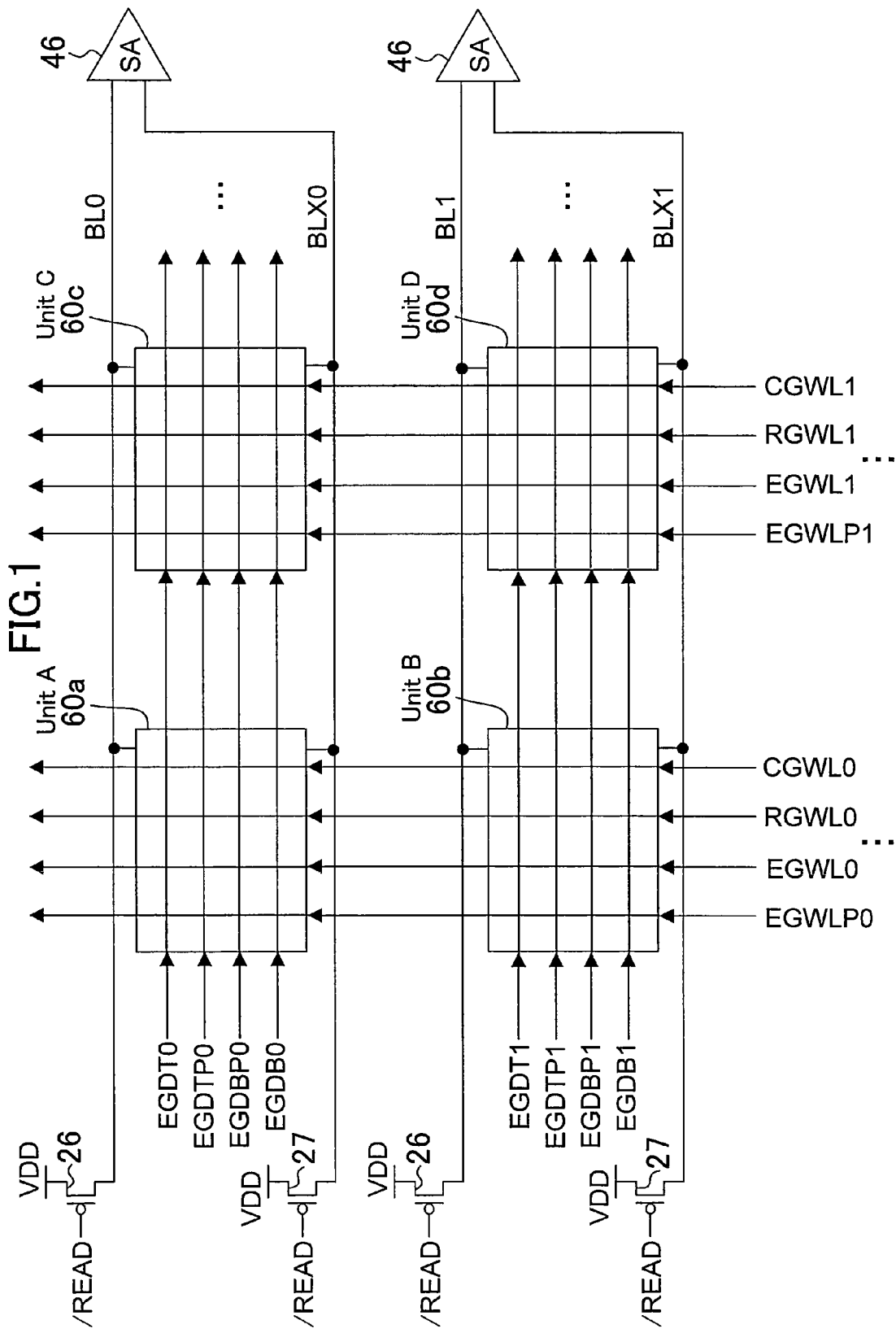
FIG. 1 is a circuit diagram showing a memory array configuration of a differential cell type nonvolatile semiconductor memory device in accordance with Embodiment 1 of the present invention.

FIG. 1 shows a memory array configuration of a differential cell type nonvolatile semiconductor memory device in accordance with Embodiment 1 of the present invention. Description will be given herein about two by two array memory units (four units of a unit A, a unit B, a unit C, and a unit D) 60a, 60b, 60c, 60d. The unit A and the unit B belonging to the first row share four word lines (CGWL0, RGWL0, EGWL0, and EGWLP0) while the unit C and the unit D belonging to the second row share other four word lines (CGWL1, RGWL1, EGWL1, and EGWLP1). As well, the unit A and the unit C belonging to the first column share a pair of bit lines (BL0 and BLX0) while the unit B and the unit D belonging to the second column share another pair of bit lines (BL1 and BLX1). Further, the unit A and the unit C share four signal lines (EGDT0, EGDTP0, EGDBP0, and EGDB0) while the unit B and the unit D share other four signal lines (EGDT1, EGDTP1, EGDBP1, and EGDB1). Reference numeral 26 denotes a first load transistor (PMOS), 7 denotes a second load transistor (PMOS), 46 denotes a sense amplifier, VDD denotes a power source voltage, and /READ denotes a read control signal (negative logic).

Figure 2:
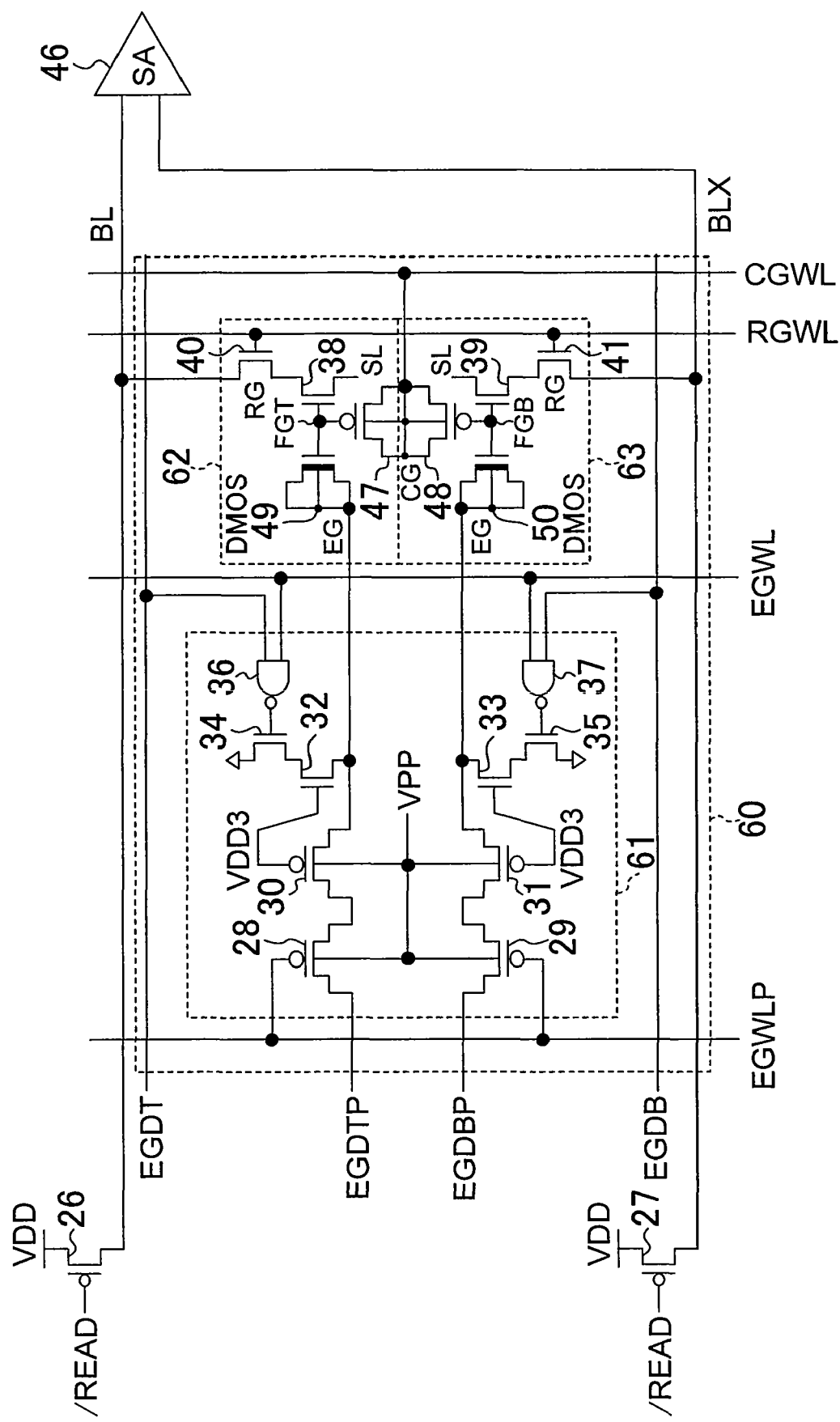
FIG. 2 is a circuit diagram of a memory unit in accordance with Embodiment 1 of the present invention.

FIG. 2 is a circuit diagram of a memory unit in accordance with Embodiment 1 of the present invention. The memory unit 60 shown in FIG. 2 corresponds to each of the memory units 60a, 60b, 60c, 60d arranged in two-by-two array in FIG. 1 and includes a decode device 61 and a T (True) bit cell 62 and B (Bar) bit cell 63 which are formed of corresponding MOS transistors. Wherein, the numerals "0" and "1" affixed to the respective signals in FIG. 1 are omitted in FIG. 2.

The decode device 61 includes: a first switching MOS transistor 28 for transferring a selective erase signal to the erase gate (EG) of the T bit cell 62; a second switching MOS transistor 34 for discharging electrons from the EG node of the T bit cell 62; a gate/drain voltage relaxing third MOS transistor 30 between the erase gate (EG) of the T bit cell 62 and the switching first MOS transistor 28; a gate/drain voltage relaxing fourth MOS transistor 32 between the erase gate (EG) of the T bit cell 62 and the switching second MOS transistor 34; a switching fifth MOS transistor 29 for transferring a selective erase signal to the erase gate (EG) of the B bit cell 63; a switching sixth MOS transistor 35 for discharging electrons from the EG node of the B bit cell 63; a gate/drain voltage relaxing seventh MOS transistor 31 between the erase gate (EG) of the B bit cell 63 and the switching fifth MOS transistor 29; and a gate/drain voltage relaxing eighth MOS transistor 33 between the erase gate (EG) of the B bit cell 63 and the switching sixth MOS transistor 35.

The T bit cell 62 includes: a first capacitor 47 composed of a MOS transistor forming a control gate (CG); a second capacitor 49 composed of a MOS transistor forming an erase gate (EG); a first NMOS transistor 38 having a source connected to a common source line (SL) and a gate shared by the first capacitor 47 and the second capacitor 49 to form a floating gate (FGT); and a second NMOS transistor 40 having a source connected to the drain of the first NMOS transistor 38 and a drain connected to the bit line (BL).

The B bit cell 63 includes: a third capacitor 48 composed of a MOS transistor forming a control gate (CG); a fourth capacitor 50 composed of an MOS transistor forming an erase gate (EG); a third NMOS transistor 39 having a source connected to a common source line (SL) and a gate shared by the third capacitor 48 and the fourth capacitor 50 to form a floating gate (FGB); and a fourth NMOS transistor 41 having a source connected to the drain of the third NMOS transistor 39 and a drain connected to the bit complementary line (BLX).

The control gate (CG) of the T bit cell 62 and the control gate (CG) of the B bit cell 63 are connected to the control gate control line (CGWL). The first NMOS transistor 38 of the T bit cell 62 and the third NMOS transistor 39 of the B bit cell 63 serve as read transistors. The second NMOS transistor 40 of the T bit cell 62 and the fourth NMOS transistor 41 of the B bit cell 63 serve as selection transistors, wherein each gate thereof is connected to the read gate control line (RGWL).

The switching first MOS transistor 28 is a PMOS transistor. The gate thereof is connected to the first erase gate control line (EGWLP), one of the source and the drain thereof is connected to the first erase signal line (EGDTP), and the other one thereof is connected to the voltage relaxing third MOS transistor 30.

The switching second MOS transistor 34 is an NMOS transistor and includes a source connected to the ground potential, a drain connected to the voltage relaxing fourth MOS transistor 32, and a gate connected to a logic gate 36 to which the first erase control signal line (EGDT) and the second erase gate control line (EGWL) are input. The discharge switching second MOS transistor 34 is turned ON/OFF by the first erase control signal line (EGDT) and the second erase gate control line (EGWL).

The voltage relaxing third MOS transistor 30 is a PMOS transistor. One of the source and the drain thereof is connected to the erase gate (EG) node of the T bit cell 62, the other one thereof is connected to the switching first MOS transistor 28, and the gate thereof is connected to a power source voltage (VDD3). VDD3 is voltage source higher than VDD.

The voltage relaxing fourth MOS transistor 32 is an NMOS transistor and includes a drain connected to the erase gate (EG) node of the T bit cell 62, a source connected to the switching second MOS transistor 34, and a gate connected to the power source voltage (VDD3).

The switching fifth MOS transistor 29 is a PMOS transistor. The gate thereof is connected to the first erase gate control line (EGWLP), one of the source and the drain thereof is connected to the second erase signal line (EGDBP), and the other one thereof is connected to the voltage relaxing seventh MOS transistor 31.

The switching sixth MOS transistor 35 is an NMOS transistor and includes a source connected to the ground potential, a drain connected to the voltage relaxing eighth MOS transistor 33, and a gate connected to a logic gate 37 to which the second erase control signal line (EGDB) and the second erase gate control line (EGWL) are input. The discharge switching sixth MOS transistor 35 is turned ON/OFF by the second erase control signal line (EGDB) and the second erase gate control line (EGWL). Herein, a NAND gate 37 is used as the logic gate for example.

The voltage relaxing seventh MOS transistor 31 is a PMOS transistor. One of the source and the drain thereof is connected to the erase gate (EG) node of the B bit cell 63, the other one thereof is connected to the switching fifth MOS transistor 29, and the gate thereof is connected to the power source voltage (VDD3).

The voltage relaxing eighth MOS transistor 33 is an NMOS transistor and includes a drain connected to the erase gate (EG) node of the B bit cell 63, a source connected to the switching sixth MOS transistor 35, and a gate connected to the power source voltage (VDD3).

Referring to the memory unit 60 shown in FIG. 2, when parts under the drains of MOS transistors composing the decode device 61 are subjected to well injection, the reliability of the decode device 61, to which high voltage is applied, is enhanced.

Figure 3:
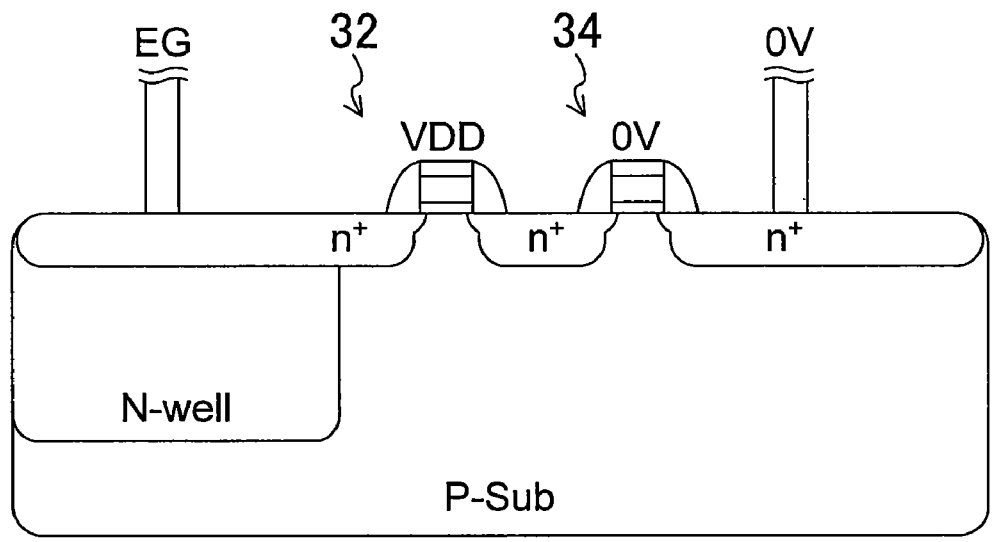
FIG. 3 is a sectional view showing one example for improving the drain junction breakdown voltage of transistors composing the memory unit in accordance with Embodiment 1 of the present invention.

FIG. 3 is one example of a sectional view of the switching second MOS transistor 34 and the voltage relaxing fourth MOS transistor 32 of the decode device 61 of the memory unit 60 in FIG. 2. When a part under the drain of the fourth MOS transistor 32, to which high voltage is applied, is subjected to N-well injection, the drain junction breakdown voltage increases to enhance the reliability of the decode device 61.

Figure 4:
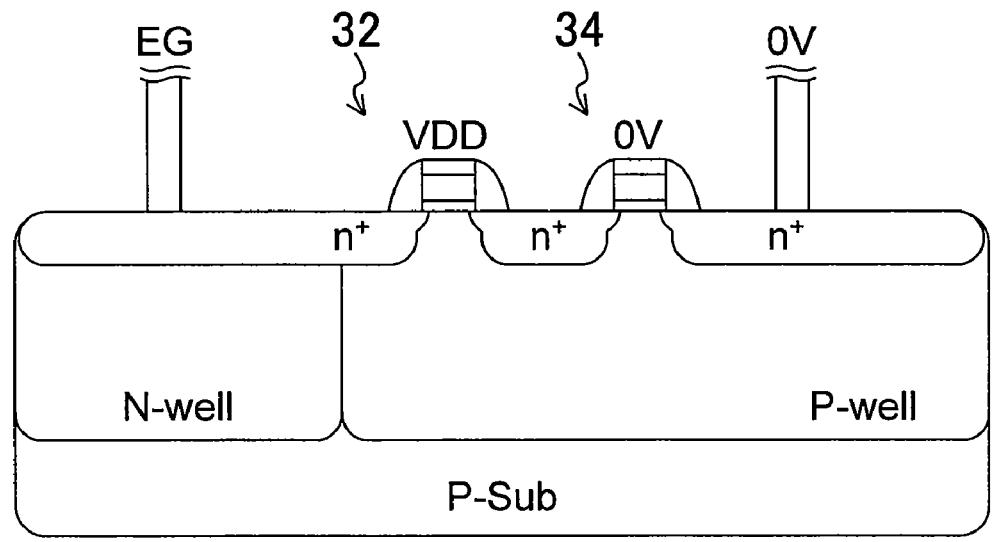
FIG. 4 is a sectional view showing another example for improving the drain junction breakdown voltage of the transistors composing the memory unit in accordance with Embodiment 1 of the present invention.

In the case where a triple well process is employable, additional P well injection as shown in FIG. 4 further increases the drain junction breakdown voltage of the fourth MOS transistor 32.

The above well injection is applicable to the switching first MOS transistor 28 and the voltage relaxing third MOS transistor 30. As well, it is applicable to the switching fifth MOS transistor 29, the voltage relaxing seventh MOS transistor 31, the switching sixth MOS transistor 35, and the voltage relaxing eighth MOS transistor 33, which means that it is applicable to all of the transistors in the memory cell array.

Referring to the MOS transistors composing the memory unit 60 in FIG. 2, the thickness of the gate oxide films may be substantially equal to that of the gate oxide film of a MOS transistor composing an input/output circuit of an LSI.

Figure 5:
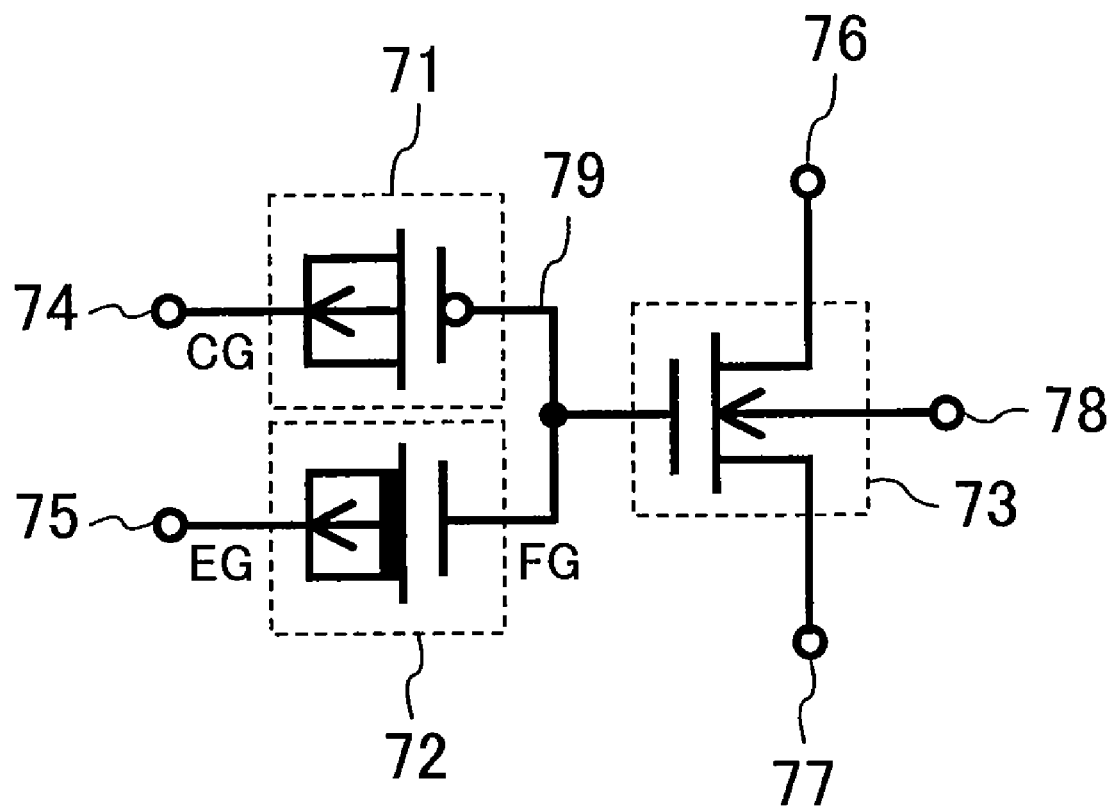
FIG. 5 is a circuit diagram of a nonvolatile memory element in accordance with Embodiment 1 of the present invention.
Figure 6:
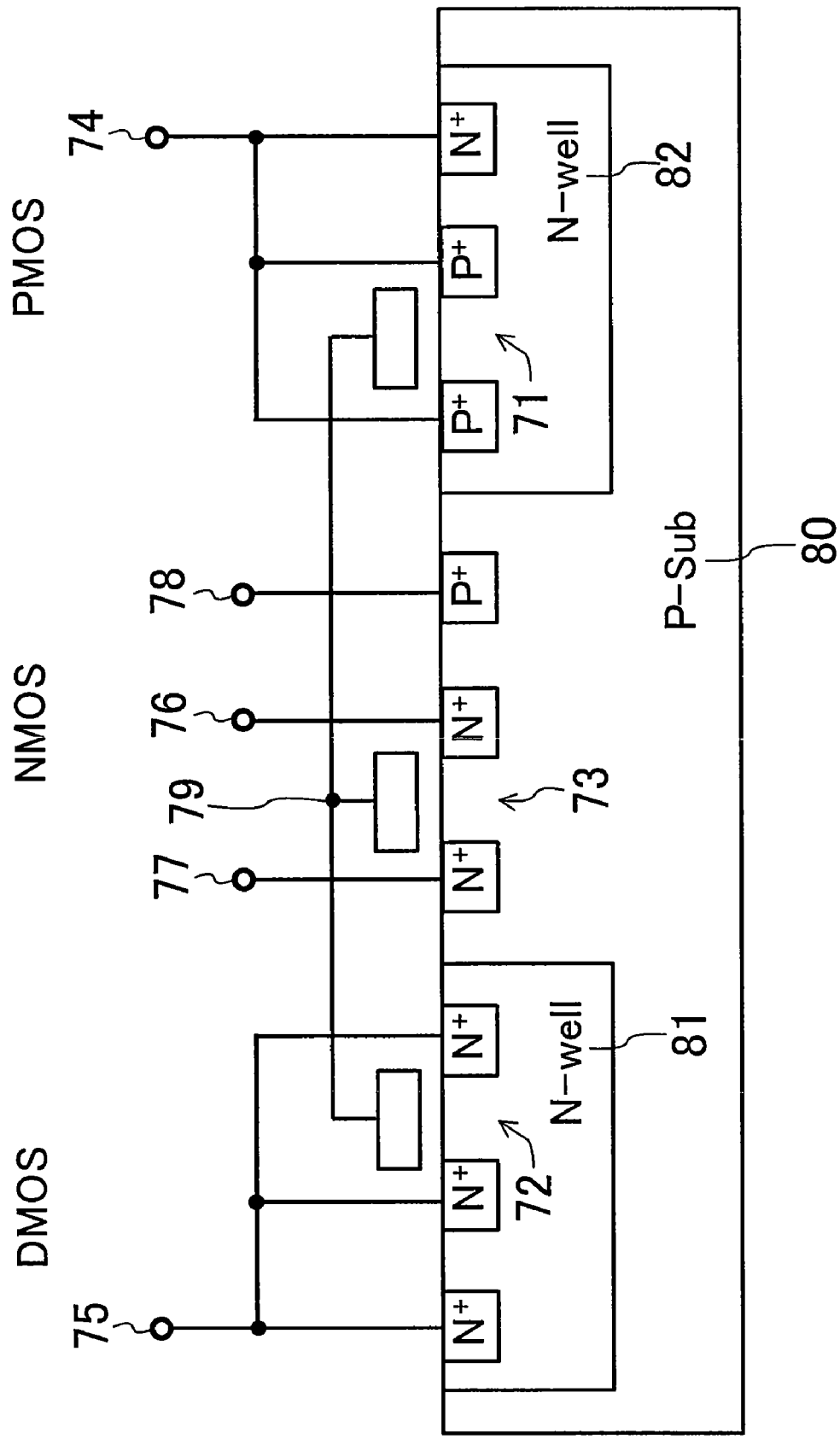
FIG. 6 is a sectional view of the nonvolatile memory element in accordance with Embodiment 1 of the present invention.

FIG. 5 is a circuit diagram of a nonvolatile memory element in accordance with Embodiment 1 of the present invention, and FIG. 6 is a sectional view thereof. The nonvolatile memory element in accordance with the present invention includes three transistors of a control gate PMOS transistor 71, a read NMOS transistor 73, and an erase gate N-type depression MOS transistor (hereinafter referred to a DMOS) transistor 72.

In FIG. 5, reference numeral 74 denotes a control gate (CG), 75 denotes an erase gate (EG), 76 denotes a drain terminal of the NMOS transistor, 77 denotes a source terminal of the NMOS transistor, 78 denotes a P-type silicon substrate terminal, and 79 is a floating gate (FG). In FIG. 6, reference numeral 81 and 82 each denote an N-type well region, and 80 denotes a P-type silicon substrate. The polysilicon gates of PMOS 71, NMOS 73, and DMOS 72 are connected to one another electrically to form a floating gate (FG) 79 of the nonvolatile memory element. The N-type well region 82 of PMOS 71 and the N-type well region 81 of DMOS 72 form a control gate (CG) 74 and an erase gate (EG) 75, respectively. Herein, DMOS 72 can be fabricated with no additional mask needed in the CMOS process.

Write takes place by electron injection by FN tunneling in the entire channel of the NMOS transistor 73 as a read transistor. Erase takes place by electron discharge by FN tunneling in an overlap region of the floating gate (FG) 79 as the gate of DMOS 72 and the source/drain (S/D) diffusion layer. During erase, DMOS 72 as an erase gate transistor is operated in a depletion state to minimize the capacitance between the floating gate (FG) 79 and the N-type well region 81 of DMOS 72 (to about 28% of the storage capacitance), so that the voltage applied between the floating gate (FG) 79 and the N-type well region 81 of DMOS 72 increases, thereby attaining high-speed erase when compared with conventional one.

FIG. 7 shows one example set of bias conditions that the bit cells 62, 63 in Embodiment 1 of the present invention must satisfy. First described is bias conditions for a standby operation. In the standby state, no data write is performed in the bit cells 62, 63, and therefore, the read gate control line (RGWL), the control gate control line (CGWL), the T bit erase gate (EGT), and the B bit erase gate (EGB) are set to 0 volt while a boosted voltage (VPP) terminal is set at VDD3-Vt irrespective of a selection or non-selection state, wherein VDD3 is a power source voltage higher than VDD and is 3.3 volts, for example, and Vt is a threshold voltage of the MOS transistors.

Bias conditions for a read operation will be described. In a selected cell, the power source voltage (VDD) is applied to the control gate control line (CGWL) and the read gate control line (RGWL) while zero volt is applied to the T bit erase gate (EG) and the B bit erase gate (EG). In a non-selected cell, zero volt is applied to the control gate control line (CGWL), the read gate control line (RGWL), the T bit erase gate (EG), and the B bit erase gate (EG).

Bias conditions for a programming operation will be described. In a selected cell, which performs data programming, VPP is applied to the control gate control line (CGWL), the T bit erase gate (EG), and the B bit erase gate (EG) while zero volt is applied to the read gate control line (RGWL). In a non-selected cell, which performs no data programming, the control gate control line (CGWL), the T bit erase gate (EG), the B bit erase gate (EG), and the read gate control line (RGWL) are set to zero volt.

Bias conditions for an erase operation in the T bit cell 62 of the differential cell will be described. In a selected cell, boosted voltage (VPP) is applied to the T bit erase gate (EG) that performs erase while the control gate control line (CGWL), the B bit erase gate (EG), the read gate control line (RGWL) are set to zero volt. In a non-selected cell, in which no data erase is performed, the control gate control line (CGWL), the T bit erase gate (EG), the B bit erase gate (EG), and the read gate control line (RGWL) are set to zero volt.

Bias condition for an erase operation in the B bit cell 63 of the differential cell will be described. In a selected cell, VPP is applied to the B bit erase gate (EG) that performs erase while the control gate control line (CGWL), the T bit erase gate (EG), the read gate control line (RGWL) are set to zero volt. In a non-selected cell, in which no data erase is performed, the control gate control line (CGWL), the T bit erase gate (EG), the B bit erase gate (EG), and the read gate control line (RGWL) are set to zero volt.

Description will be given next about entire operation of the differential type memory unit 60 with reference to FIG. 8 to FIG. 12.

Figure 8:
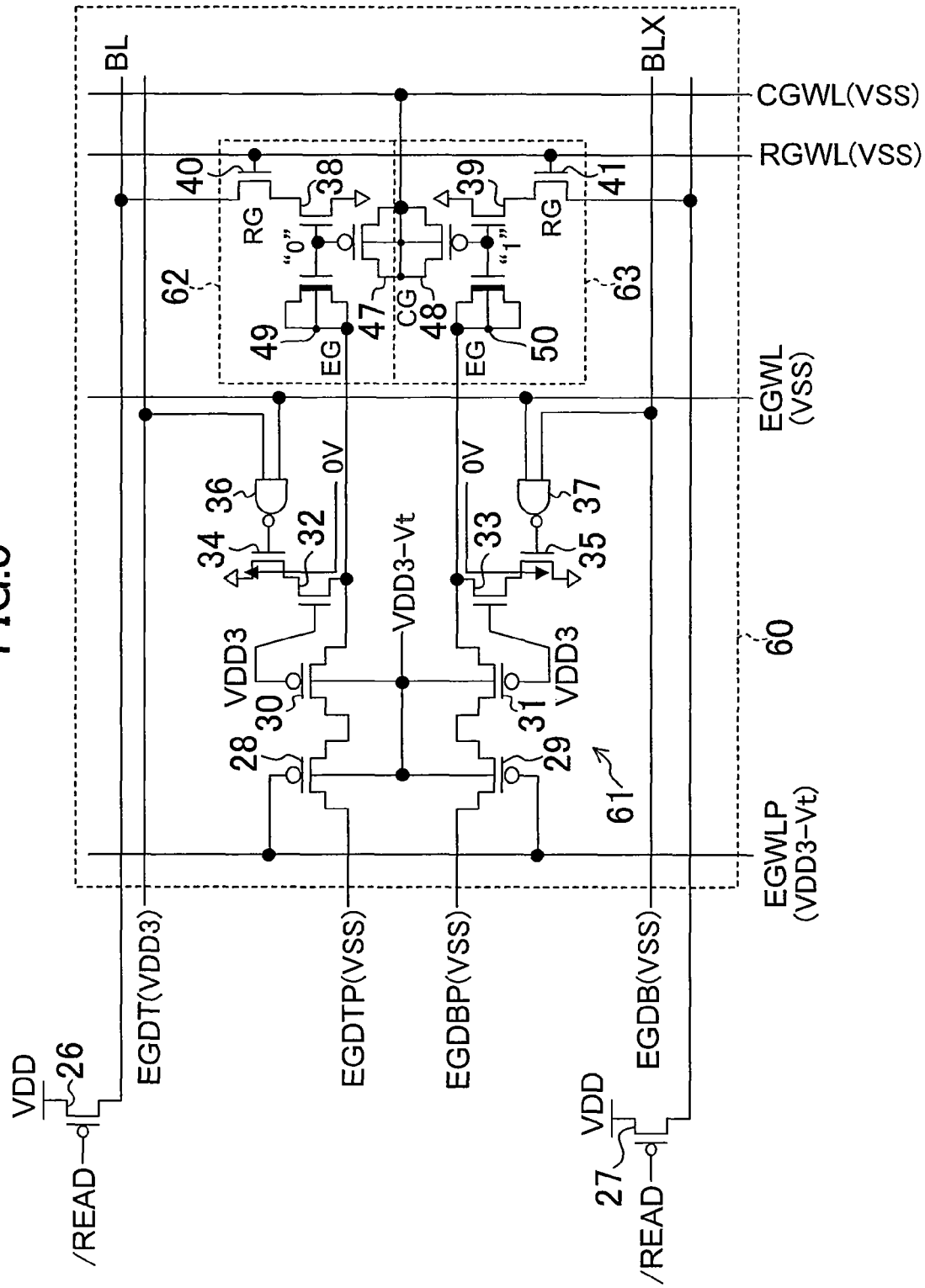
FIG. 8 is a circuit diagram showing a standby operation of a memory unit in accordance with Embodiment 1 of the present invention.

FIG. 8 shows the bias conditions in the standby state. In the standby state, the bit cells 62, 63 perform no data write, and therefore, the read gate control line (RGWL), the control gate control line (CGWL), the first erase signal line (EGDTP), the second erase signal line (EGDBP), the second erase control signal line (EGDB), and the second erase gate control line (EGWL) are set to the voltage of VSS (=zero volt) irrespective of the selected state or the non-selected state.

Figure 9:
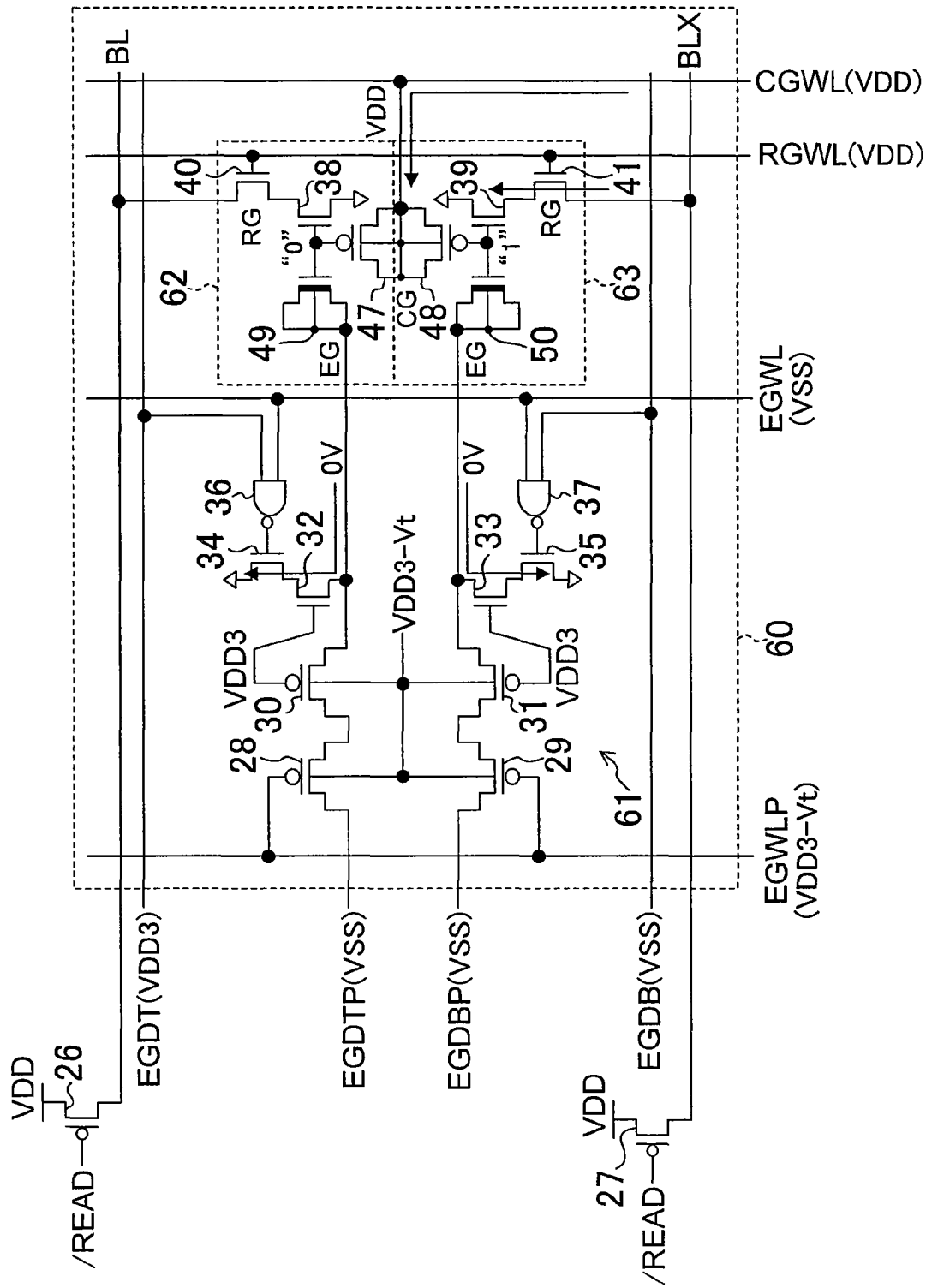
FIG. 9 is a circuit diagram showing a read operation of a memory unit in accordance with Embodiment 1 of the present invention.

FIG. 9 shows the bias conditions in the read state. First, the low-level (zero volt) read control signal (/READ) is applied to each gate of the first load transistor 26 and the second load transistor 27 to allow the first load transistor 26 and the second load transistor 27 to be turned ON. Further, the potential of the source line (SL) is set to a low level, and high-level voltage (VDD) is applied to the selected control gate control line (CGWL) and read gate control line (RGWL). In addition, the low-level voltage (VSS) is applied to the other second erase gate control line (EGWL), the second erase control signal line (EGDB), the first erase signal line (EGDTP), and the second erase signal line (EGDBP), the voltage of (VDD3-Vt) is applied to the first erase gate control line (EGWLP), and the high-level voltage (VDD3) is applied to the first erase control signal line (EGDT). Whereby, the bit cells 62, 63 connected to the selected control gate control line (CGWL) become conductive. Suppose herein, for example, that charges are injected in the floating gate (FGB) of the B bit cell 63. This causes potential difference between the bit complementary line (BLX) connected to the B bit cell 63 and the bit line (BL) connected to the T bit cell 62 to which no charge is injected, so that the thus caused potential difference can be read out as data through the sense amplifier 46. During this read, in the other bit cell connected to the non-selected control gate control line (CGWL), the low-level voltage (VSS) is applied to the control gate control line (CGWL) and the read gate control line (RGWL), and accordingly, each selected transistor is turned OFF to be electrically cut off from the bit line pair (BL, BLX). Hence, no influence of the non-selected bit cell affects the bit line pair (BL, BLX).

Figure 10:
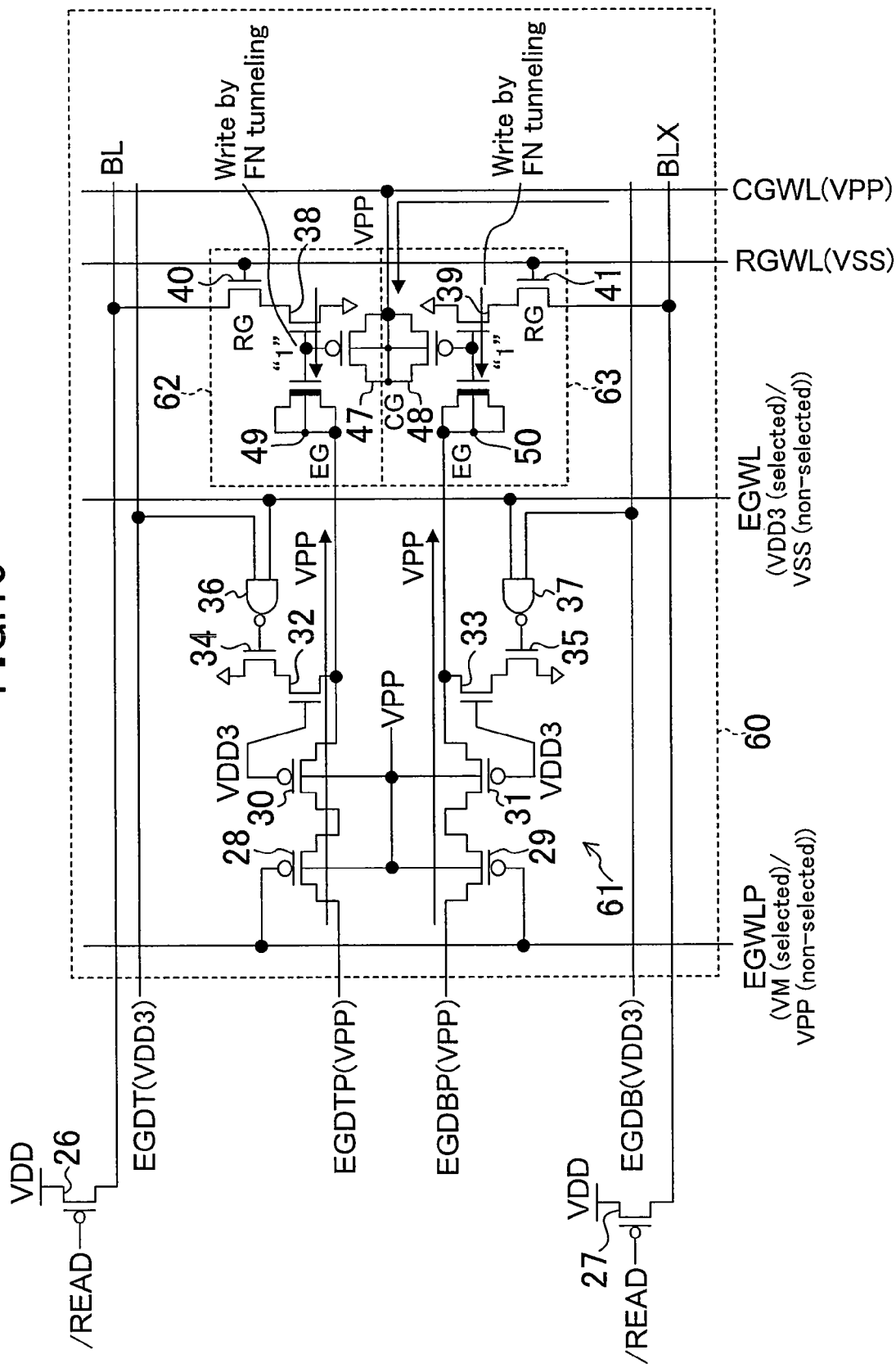
FIG. 10 is a circuit diagram showing a programming operation of a memory unit in accordance with Embodiment 1 of the present invention.

FIG. 10 shows the bias conditions in the programming state. In the programming operation, both the T bit cell 62 and the B bit cell 63 are programmed. Given that the control gate control line (CGWL), the read gate control line (RGWL), and the second erase gate control line (EGWL) are selected from the outside. The high-level voltage (VDD3) is applied to the selected second erase gate control line (EGWL); the high-level boosted voltage (VPP) is applied to the control gate control line (CGWL); the low-level voltage (VSS) is applied to the read gate control line (RGWL), intermediate voltage (VM) of VPP is applied to the first erase gate control line (EGWLP); the high-level boosted voltage (VPP) is applied to the first erase signal line (EGDTP) and the second erase signal line (EGDBP); and the high-level voltage (VDD3) is applied to the first erase control signal line (EGDT) and the second erase control signal line (EGDB). Whereby, the high-level boosted voltage (VPP) is applied to each control gate (CG) terminal and each erase gate (EG) terminal of the T bit cell 62 and the B bit cell 63. Upon the voltage application, FN tunneling is caused in the first NMOS transistor 38 of the T bit cell 62 and the third NMOS transistor 39 of the B bit cell 63 to allow the electrons to be injected from the channels to the floating gates to thus write the data. In contrast, in the other bit cell connected to the non-selected control gate control line (CGWL) and the like, the low-level voltage (VSS) is applied to the control gate control lines (CGWL), so that no charge is injected to the floating gates of the non-selected bit cell. VPP is a boosted voltage of seven to ten volts while VM is an intermediate voltage of 3.5 to 5 volts, for example.

The erase operation will be described. The erase operation in the differential cell is performed in such a manner that one of the T bit and B bit is erased and data "1" and "0" are stored into a complementary cell.

Figure 11:
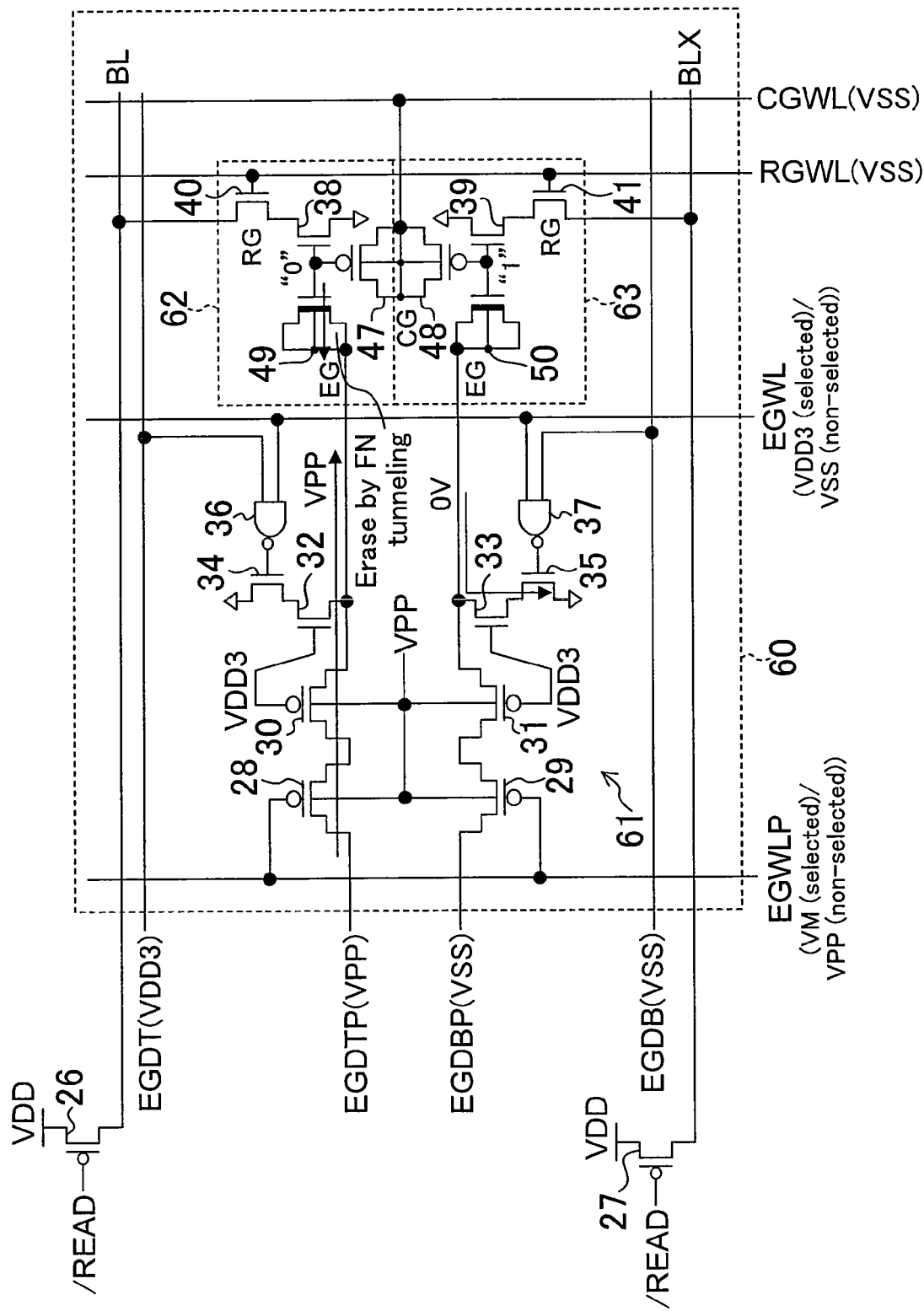
FIG. 11 is a circuit diagram showing a T bit erase operation of a memory unit in accordance with Embodiment 1 of the present invention.

FIG. 11 shows the bias conditions for erasing the T bit. Given that the second erase gate control line (EGWL), the first erase gate control line (EGWLP), and the first erase control signal line (EGDT) are selected from the outside. The high-level voltage (VDD3) is applied to the selected second erase gate control line (EGWL); the low-level voltage (VSS) is applied to the control gate control line (CGWL); the low level voltage (VSS) is applied to the read gate control line (RGWL); the intermediate voltage (VM) of VPP is applied to the first erase gate control line (EGWLP); the high-level boosted voltage (VPP) is applied to the first erase signal line (EGDTP); the low-level voltage (VSS) is applied to the second erase signal line (EGDBP); the high-level voltage (VDD3) is applied to the first erase control signal line (EGDT); and the low-level voltage (VSS) is applied to the second erase control signal line (EGDB). Whereby, the low-level voltage (VSS) is applied to each control gate (CG) terminal of the T bit cell 62 and the B bit cell 63, the high-level boosted voltage (VPP) is applied to each erase gate (EG) terminal of the T bit cell 62 and the B bit cell 63, the high-level voltage (VPP) is applied to the erase gate (EG) terminal of the T bit cell 62, and the low-level voltage (VSS) are applied to the erase gate (EG) terminal of the B bit cell 63. Upon the voltage application, accumulated charges are discharged from the floating gate (FGT) of the T bit cell 62 to the erase gate (EG) of the T bit cell (62) to thus erase the data. No erase takes place in the B bit cell 63.

Figure 12:
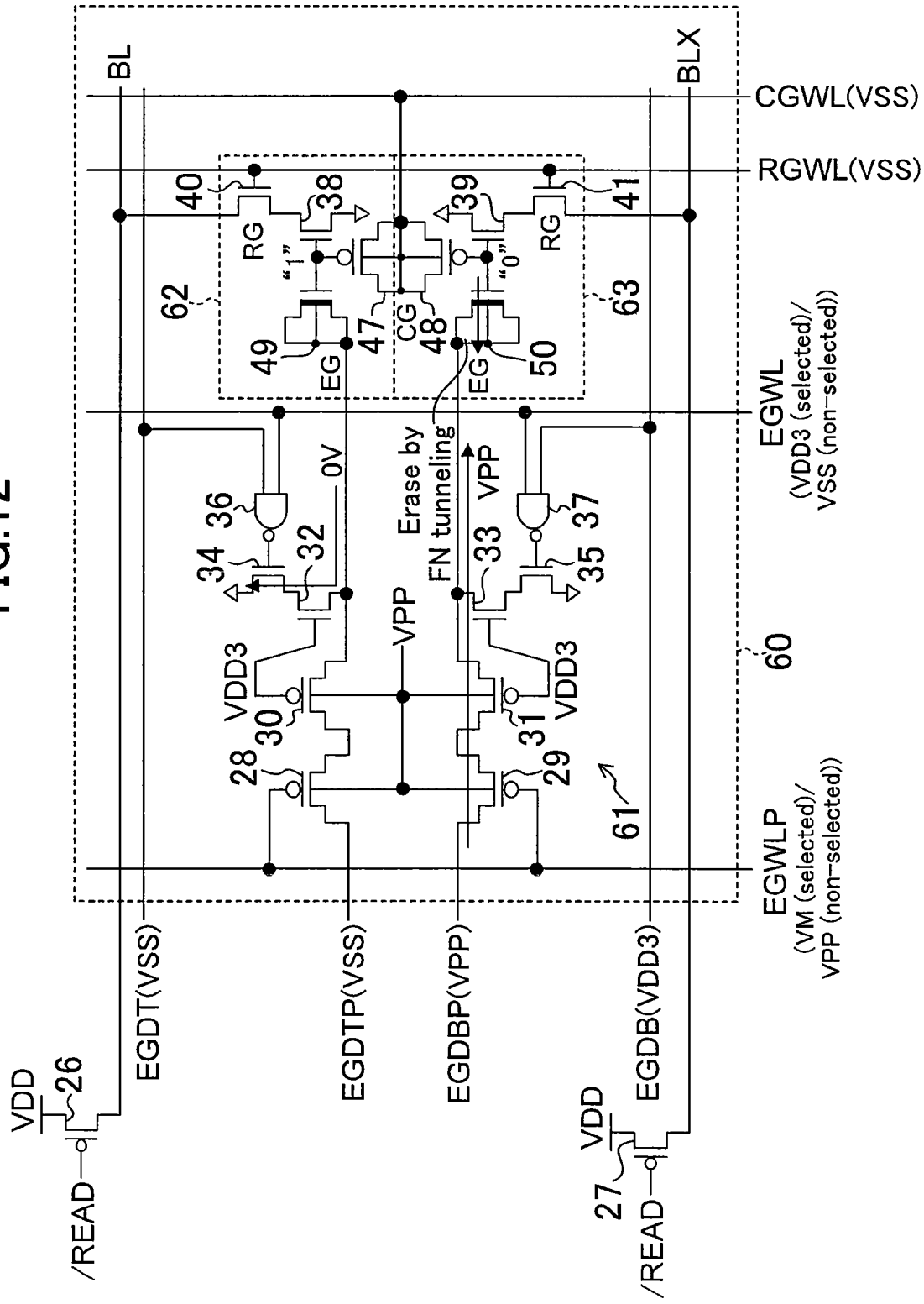
FIG. 12 is a circuit diagram showing a B bit erase operation of a memory unit in accordance with Embodiment 1 of the present invention.

FIG. 12 shows the bias conditions for erasing the B bits. Given that the second erase gate control line (EGWL), the first erase gate control line (EGWLP), and the second erase control signal line (EGDB) are selected. The high-level voltage (VDD3) is applied to the selected second erase gate control line (EGWL); the low-level voltage (VSS) is applied to the control gate control line (CGWL); the low-level voltage (VSS) is applied to the read gate control line (RGWL); the intermediate voltage (VM) of VPP is applied to the first erase gate control line (EGWLP); the low-level voltage (VSS) is applied to the first erase signal line (EGDTP); the high-level boosted voltage (VPP) is applied to the second erase signal line (EGDBP); the low-level voltage (VSS) is applied to the first erase control signal line (EGDT); and the high-level voltage (VDD3) is applied to the second erase control signal line (EGDB). Whereby, the low-level voltage (VSS) is applied to each control gate (CG) terminal of the T bit cell 62 and the B bit cell 63, the low-level voltage (VSS) is applied to the erase gate (EG) terminal of the T bit cell 62, and the high-level boosted voltage (VPP) is applied to the erase gate (EG) terminal of the B bit cell 63. Upon the voltage application, accumulated charges are discharged from the floating gate (FGB) of the B bit cell 63 to the erase gate (EG) of the B bit cell 63 to thus erase the data. No erase takes place in the T bit cell 62.

In the standby operation (FIG. 8) and the read operation (FIG. 9), the first erase control signal line (EGDT) is set at VDD3 as one example and is not necessarily set at VDD3. In the standby operation (FIG. 8) and the read operation (FIG. 9), in order to set the erase gate (EG) of the T bit cell 62 and the erase gate (EG) of the B bit cell 63 at zero volt, only the second erase gate control line (EGWL) is set at VSS. Accordingly, in the standby operation and the read operation, voltages of the first erase control signal line (EGDT) and the second erase control signal line (EGDB) may be DON'T CARE.

Figures 13, 14:
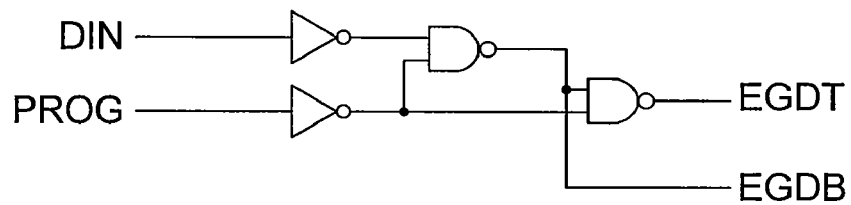
FIG. 13 is a circuit diagram showing one example of an erase control signal generation circuit for a memory unit in accordance with Embodiment 1 of the present invention.
FIG. 14 is a table explaining operations of the circuit shown in FIG. 13.

FIG. 13 presents a circuit example where an input data signal (DIN) and a program singal (PROG) are input and output to the first erase control signal line (EGDT) and the second erase control signal line (EGDB). FIG. 14 summarizes the voltage levels of the first erase control signal line (EGDT) and the second erase control signal line (EGDB) in each of the programming operation, the erase operation, the read operation, and the standby operation.

In the programming operation, the input data signal (DIN) is a DON'T CARE voltage and the program singal (PROG) is set at the high-level voltage (VDD3, for example), and the high-level voltage (VDD3) is output to both the first erase control signal line (EGDT) and the second erase control signal line (EGDB).

In the erase operation, when the input data signal (DIN) is the low-level voltage (VSS) and the program singal (PROG) is the low-level voltage (VSS), the high-level voltage (VDD3) is output to the first erase control signal line (EGDT) while the low-level voltage (VSS) is output to the second erase control signal line (EGDB). When the input data signal (DIN) is the high-level voltage (VDD3) while the program signal (PROG) is the low-level voltage (VSS), the low-level voltage (VSS) is output to the first erase control signal line (EGDT) while the high-level voltage (VDD3) is output to the second erase control signal line (EGDB). With the above bias voltage setting, when an arbitrary column line is selected, voltage is transferred to the erase gate (EG) of the T bit cell 62 and the erase gate (EG) of the B bit cell 63 on the basis of the input data, which achieves bit by bit selective erase operation.

In the read operation and the standby operation, as described above, the input data signal (DIN) is a DON'T CARE voltage while the program signal (PROG) is the low-level voltage (VSS), and the first erase control signal line (EGDT) and the second erase control signal line (EGDB) are the DON'T CARE voltages. In this case, when the second erase gate control line (EGWL) is set at VSS, VSS can be output to the erase gate (EG) of the T bit cell 62 and the erase gate (EG) of the B bit cell 63.

Figures 15, 16:
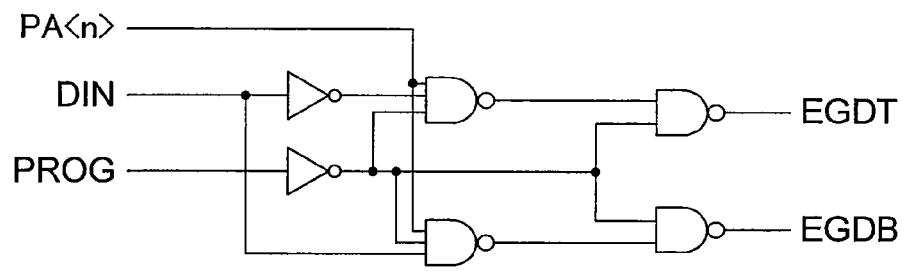
FIG. 15 is a circuit diagram showing another example of the erase control signal generation circuit for a memory unit in accordance with Embodiment 1 of the present invention.
FIG. 16 is a table explaining operations of the circuit shown in FIG. 15.

FIG. 15 presents a circuit example where a pre-decoded address signal (PA<n>), an input data signal (DIN), and a program signal (PROG) are input and output to the first erase control signal line (EGDT) and the second erase control signal line (EGDB). FIG. 16 summarizes the voltage levels of the first erase control signal line (EGDT) and the second erase control signal line (EGDB) in each of the programming operation, the erase operation, the read operation, and the standby operation.

As referred to in the above-mentioned example, when the first erase control signal line (EGDT) and the second erase control signal line (EGDB) are generated from the pre-decoded address signal (PA<n>), the input data signal (DIN), and the program signal (PROG), an arbitrary column line can be selected to achieve bit by bit selective erase.

In the programming operation, the address signal (PA<n>) and the input data signal (DIN) are DON'T CARE voltages while the program signal (PROG) is set at high-level voltage (VDD3, for example) to output the high-level voltage (VDD3) to both the first erase control signal line (EGDT) and the second erase control signal line (EGDB). When the control lines are set at the respective bias voltages referred to in FIG. 10, both the T bit cell 62 and the B bit cell 63 can be programmed.

In the erase operation, when the address signal (PA<n>) is the high-level voltage (VDD3), the input data signal (DIN) is the low-level voltage (VSS), and the program signal (PROG) is the low-level voltage (VDD3), the high-level voltage (VDD3) and the low-level voltage (VSS) are output to the first erase control signal line (EGDT) and the second erase control signal line (EGDB), respectively. As well, when the address signal (PA<n>) is the high-level voltage (VDD3), the input data signal (DIN) is the high-level voltage (VDD3), and the program signal (PROG) is the low-level voltage (VSS), the low-level voltage (VSS) and the high-level voltage (VDD3) are output to the first erase control signal line (EGDT) and the second erase control signal line (EGDB), respectively. With the above bias voltage setting, when an arbitrary column line is selected, voltage is transferred to the erase gate (EG) of the T bit cell 62 and the erase gate (EG) of the B bit cell 63 on the basis of the input data, which achieves bit by bit selective erase operation. When the address signal (PA<n>) is the low-level voltage (VSS), the low-level voltage (VSS) is output to the first erase control signal line (EGDT) and the low-level voltage (VSS) is output to the second erase control signal line (EGDB) irrespective of the voltage levels of the input data signal (DIN) and the program singal (GROG).

In the read operation and the standby operation, the first erase control signal line (EGDT) and the second erase control signal line (EGDB) may be DON'T CARE voltages. In this case, when the second erase gate control line (EGWL) is set at VSS, the erase gate (EG) of the T bit cell 62 and the erase gate (EG) of the B bit cell 63 can be set at VSS.

Description will be given next about the bias conditions in the programming operation and the bias conditions in the selective erase operation in the memory array configuration shown in FIG. 1.

In the memory array configuration shown in FIG. 1, bit by bit selective erase can be performed in each word line. Specifically, when batch write to all the bits is performed and then bit by bit selective erase is performed, data of "1" and "0" can be stored. It is supposed herein that the unit A and the unit B connected on the same word line are selected and "0" and "1" are stored in the unit A and the unit B, respectively.

Figure 17:
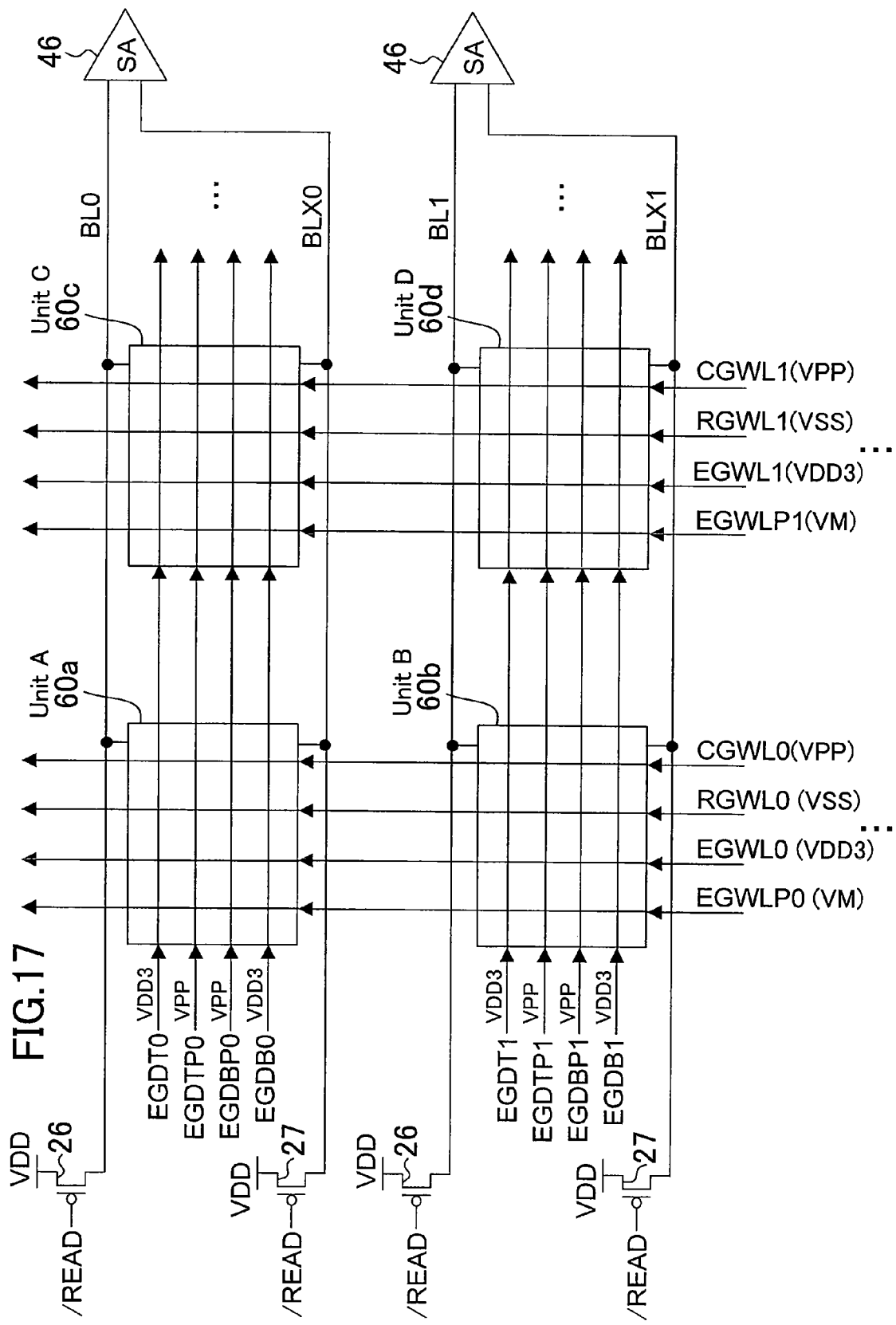
FIG. 17 is a circuit diagram showing bias conditions in the programming operation of the memory array configuration in accordance with Embodiment 1 of the present invention.

FIG. 17 shows the bias conditions in the programming operation. As shown in FIG. 17, the high-level voltage (VDD3) is applied to EGWL0 and EGWL1; the intermediate-level voltage (VM) of VPP is applied to EGWLP0 and EGWLP1; the low-level voltage (VSS) is applied to RGWL0 and RGWL1; the high-level voltage (VPP) is applied to CGWL0 and CGWL1; the high-level voltage (VDD3) is applied to EGDT0, EGDB0, EGDT1, and EGDB1; and the high-level voltage (VPP) is applied to EGDTP0, EGDBP0, EGDTP1, and EGDBP1. Under the above bias conditions, the high-level voltage of VPP is applied to CG and EG of each differential bit cell of the unit A, the unit B, the unit C, and the unit D to thus perform electron write to the floating gates. This achieves batch write to all the bits.

Figure 18:
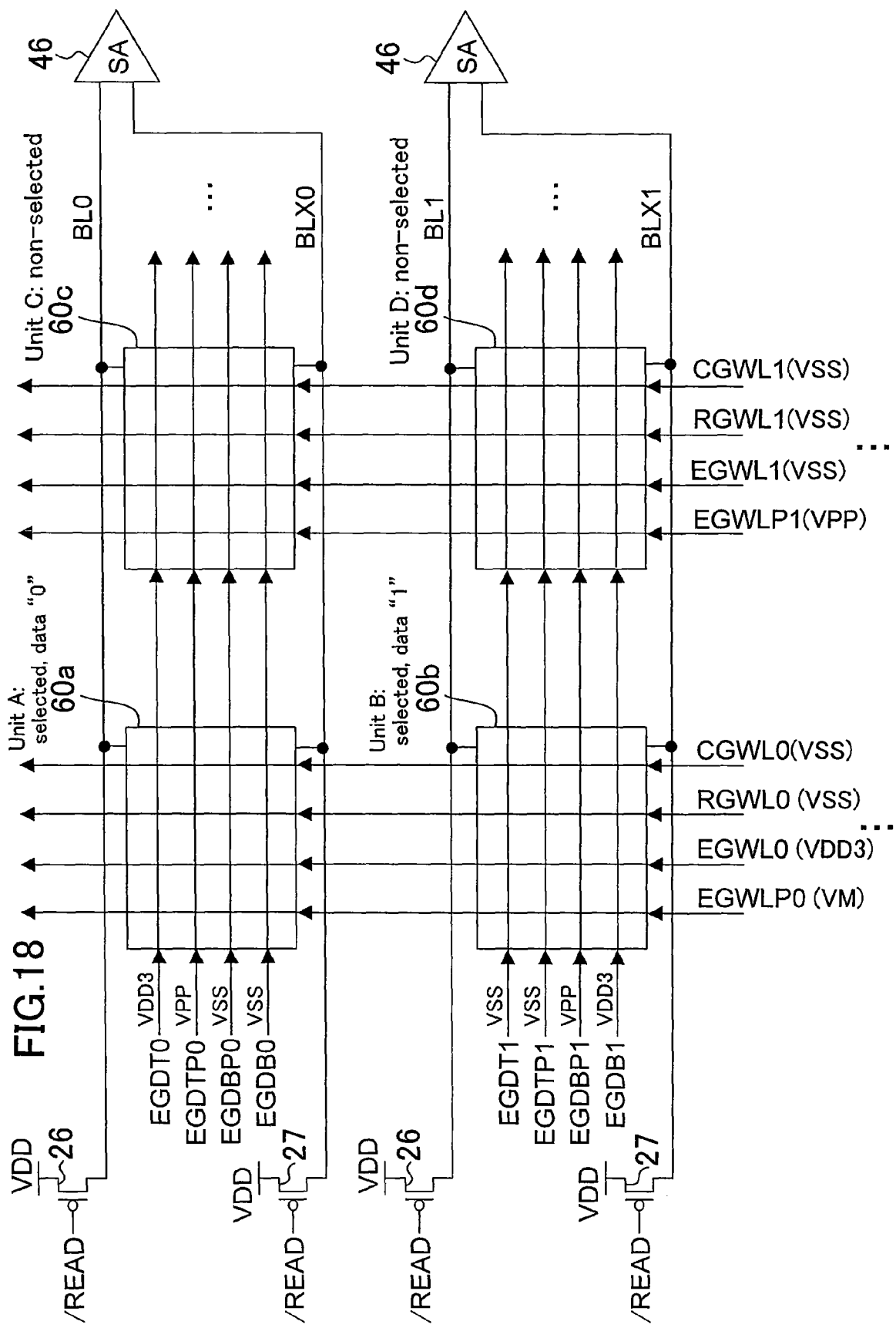
FIG. 18 is a circuit diagram showing bias conditions in the erase operation of the memory array configuration in accordance with Embodiment 1 of the present invention.

FIG. 18 shows the bias conditions in the erase operation. First referring to the row direction, the high-level voltage (VDD3) is applied to EGWL0 and the intermediate-level voltage (VM) of VPP is applied to EGWLP0 to select the word lines, as shown in FIG. 18. While on other hand, the low-level voltage (VSS) is applied to CGWL0 and RGWL0 to turn OFF the read MOS transistor. As to the non-selected word lines, the low-level voltage (VSS) is applied to EGWL1, the high-level voltage (VPP) is applied to EGWLP1, and the low-level voltage (VSS) is applied to CGWL1 and RGWL1. Referring next to the column direction, in order to write data of "0" with the unit A selected, it is necessary to erase the T bit of the differential cell of the unit A. Accordingly, as shown in FIG. 18, the T bit is erased by applying the high-level voltage (VDD3) to EGDT0 and the high-level (VPP) to EGDTP0 and applying the low-level voltage (VSS) to EGDB0 and EGDBP0 in the not-to-be-erased B bit. In contrast, in order to write data "1" with the unit B selected, it is necessary to erase the B bit of the differential cell of the unit B. This means that the bias conditions for voltage application to the T bit and B bit are set reversed to those for erasing the T bit cell of the unit A. Namely, the low-level voltage (VSS) is applied to EGDT1 and EGDTP1, the high-level voltage (VDD3) is applied to EGDB1, and the high level voltage (VPP) is applied to EGDBP1.

During the above voltage application, the high-level voltage (VPP) is applied to EGWLP1 in the non-selected unit C, and therefore, VPP at EGDTP0 is not transferred to the T bit cell of the unit C. Further, the low-level voltage (VSS) is applied to EGWL1 to allow the EG terminals of both the T bit cell and B bit cell to be discharged to the low-level voltage (VSS), thereby inhibiting the unit C from being in the erase operation mode. In the non-selected unit D, as well, the high-level voltage (VPP) is applied to EGWLP1, and therefore, VPP at EGDBP 1 is not transferred to the B bit cell of the unit D. Further, the low-level voltage (VSS) is applied to EGWL1 to allow the EG terminals of both the T bit cell and the B bit cell to be discharged to the low-level voltage (VSS), thereby inhibiting the unit D from being in the erase operation mode.

As described above, according to Embodiment 1, the nonvolatile memories which are highly reliable in data retention and capable of bit by bit selective erase can be arranged in array to reduce the core area remarkably. Further, formation of capacitors by MOS transistors achieves fabrication thereof by the CMOS process, thereby realizing a low-cost nonvolatile semiconductor memory device.

Embodiment 2

Figure 19:
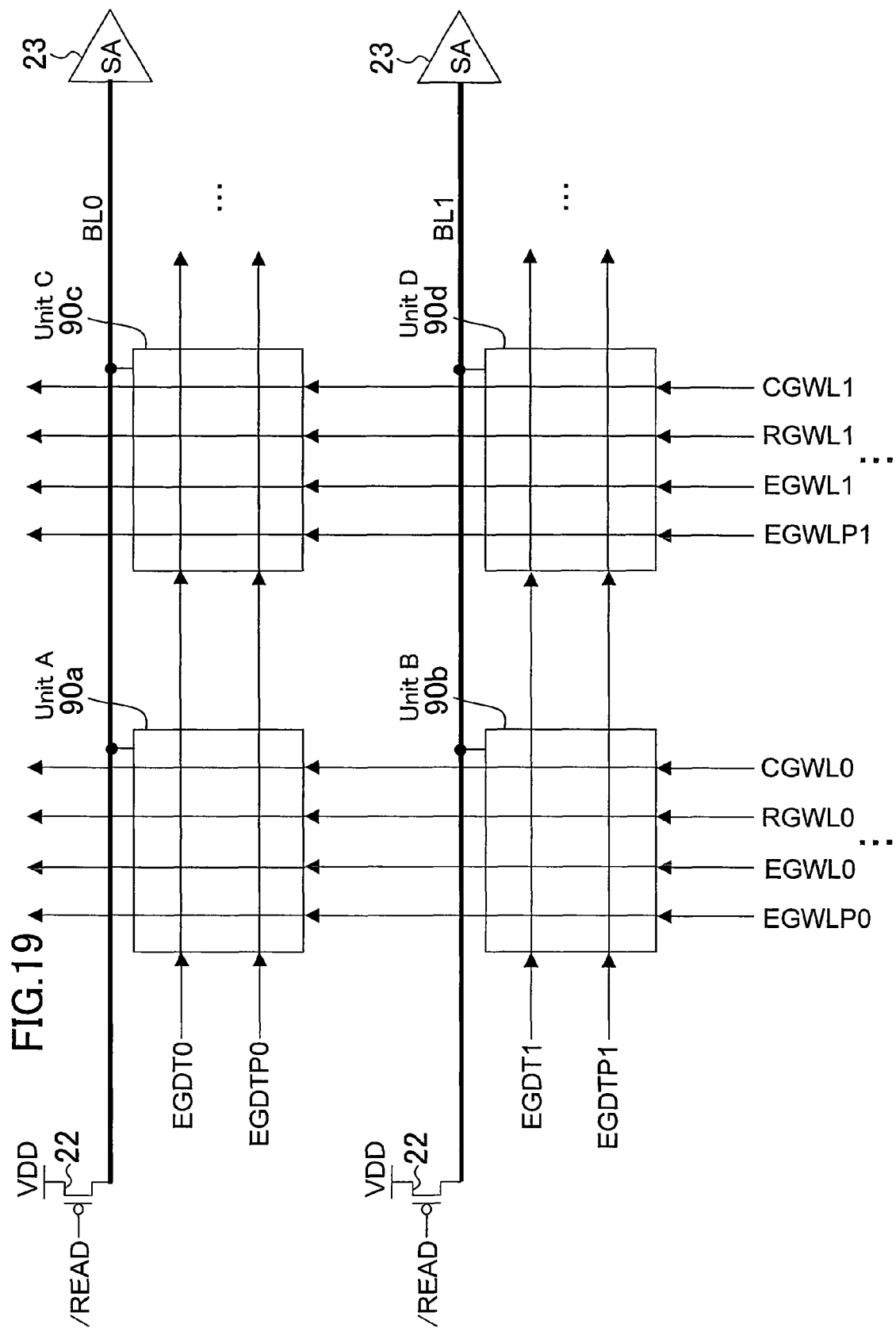
FIG. 19 is a circuit diagram showing a memory array configuration of a single cell type nonvolatile semiconductor memory device in accordance with Embodiment 2 of the present invention.

FIG. 19 shows a memory array configuration of a single cell type nonvolatile semiconductor memory device in accordance with Embodiment 2 of the present invention. Herein, as well, memory units (unit A, unit B, unit C, and unit D) 90a, 90b, 90c, 90d arranged in two by two array will be described. The unit A and the unit B belonging to the first row share four word lines (CGWL0, RGWL0, EGWL0, and EGWLP0) while the unit C and the unit D belonging to the second row share other four word lines (CGWL1, RGWL1, EGWL1, and EGWLP1). The unit A and the unit C belonging to the first column share one bit line (BL0) while the unit B and the unit D belonging to the second column share another bit line (BL1). In addition, the unit A and the unit C share two signal lines (EGDT0 and EGDTP0) while the unit B and the unit D share other two signal lines (EGDT1 and EGDTP1). Reference numeral 22 denotes a load transistor (PMOS), and 23 denotes a sense amplifier.

Figure 20:
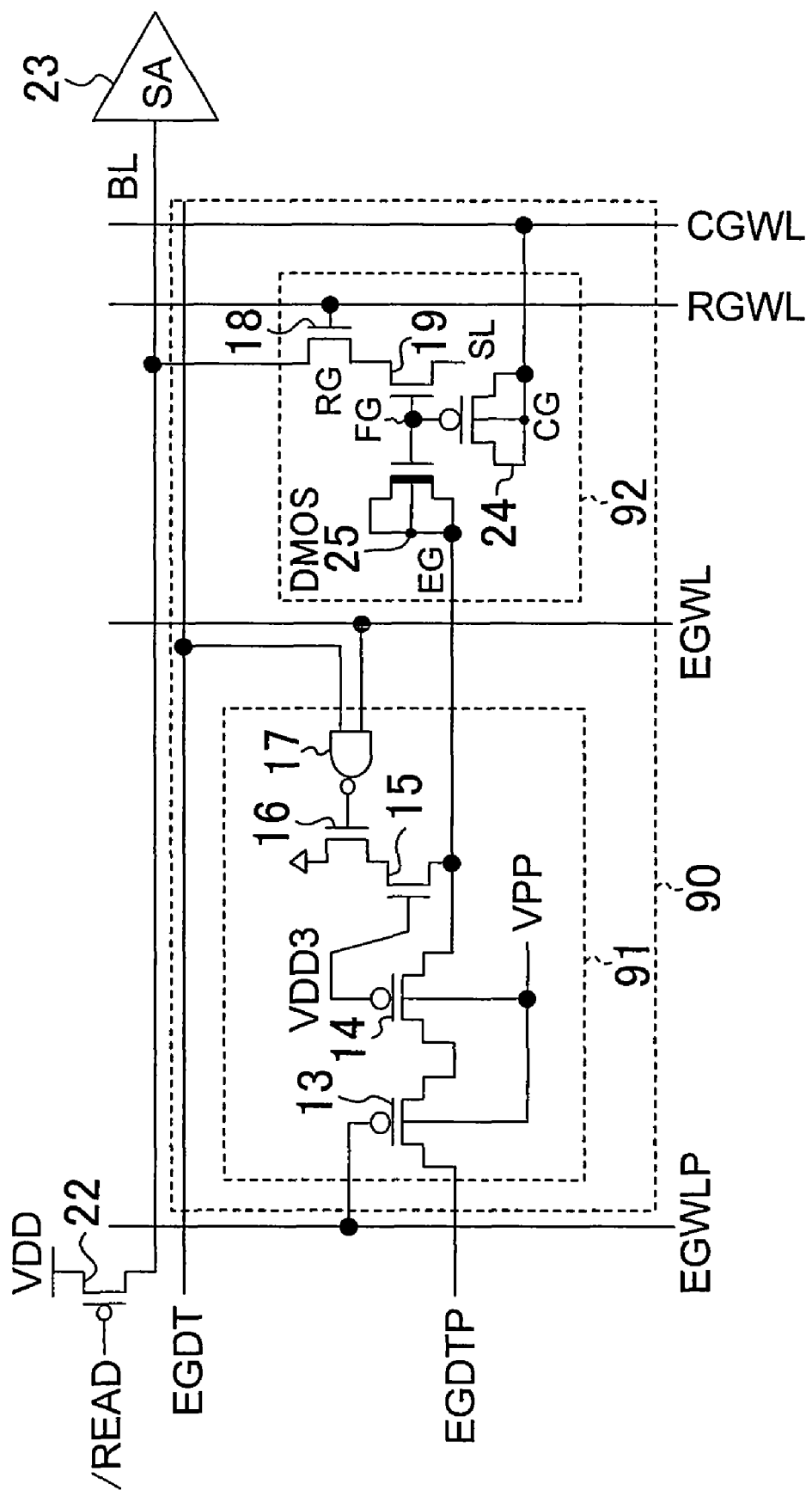
FIG. 20 is a circuit diagram of a memory unit in accordance with Embodiment 2 of the present invention.

FIG. 20 is a circuit diagram of a memory unit in accordance with Embodiment 2 of the present invention. The memory unit 90 shown in FIG. 20 corresponds to each of the memory units 90a, 90b, 90c, 90d arranged in two-by-two array in FIG. 19 and includes a decode device 91 and a bit cell 92 composed of a MOS transistor. Wherein, the numerals "0" and "1" affixed to the signals in FIG. 19 are omitted in FIG. 20.

The decode device 91 includes: a switching first MOS transistor 13 for transferring a selective erase signal to the erase gate (GE) of the bit cell 92; a switching second MOS transistor 19 for discharging electrons to the EG node of the bit cell 92; a gate/drain voltage relaxing third MOS transistor 14 between the erase gate (EG) of the bit cell 92 and the switching first MOS transistor 13; and a gate/drain voltage relaxing fourth MOS transistor 15 between the erase gate (EG) of the bit cell 92 and the switching second MOS transistor 16.

The bit cell 92 includes: a first capacitor 24 composed of a MOS transistor forming a control gate (CG); a second capacitor composed of a MOS transistor forming an erase gate (EG); a first NMOS transistor 19 including a source connected to a common source line (SL) and a gate shared by the first capacitor 24 and the second capacitor 25 to form a floating gate (FG); and a second NMOS transistor 18 including a source connected to the drain of the first NMOS transistor 19 and a drain connected to the bit line (BL). Each one end of the first and second capacitors 24, 25 is connected to the gate of the first NMOS transistor 19 to form the floating gate (FG).

The control gate (CG) of the bit cell 92 is connected to the control gate control line (CGWL). The first NMOS transistor 19 of the bit cell 92 serves as a read transistor. The second NMOS transistor 18 of the bit cell 92 serves as a selection transistor, and the gate thereof is connected to the read gate control line (RGWL).

The switching first MOS transistor 13 is a PMOS transistor. The gate thereof is connected to the first erase gate control line (EGWLP), one of the gate and the drain thereof is connected to the erase singal line (EGDTP), and the other one thereof is connected to the voltage relaxing third MOS transistor 14.

The switching second MOS transistor 16 is an NMOS transistor and includes a source connected to the ground potential, a drain connected to the voltage relaxing fourth MOS transistor 15, and a gate connected to a logic gate 17 to which the erase control signal line (EGDT) and the second erase gate control line (EGWL) are input. The discharge switching second MOS transistor 16 is turned ON/OFF by the erase control signal line (EGDT) and the second erase gate control line (EGWL). Herein, a NAND gate 17 is used as the logic gate for example.

The voltage relaxing third MOS transistor 14 is a PMOS transistor. One of the source and the drain thereof is connected to the erase gate (EG) node of the bit cell 92, the other one thereof is connected to the switching first MOS transistor 13, and the gate thereof is connected to the power source voltage (VDD3). Wherein, VDD3 is a power source voltage higher than VDD.

The voltage relaxing fourth MOS transistor 15 is an NMOS transistor and includes a drain connected to the erase gate (EG) node of the bit cell 92, a source connected to the switching second MOS transistor 16, and a gate connected to the power source voltage (VDD3).

Since the operation in Embodiment 2 is the same as that in Embodiment 1, the detailed description thereof is omitted.

Figure 21:
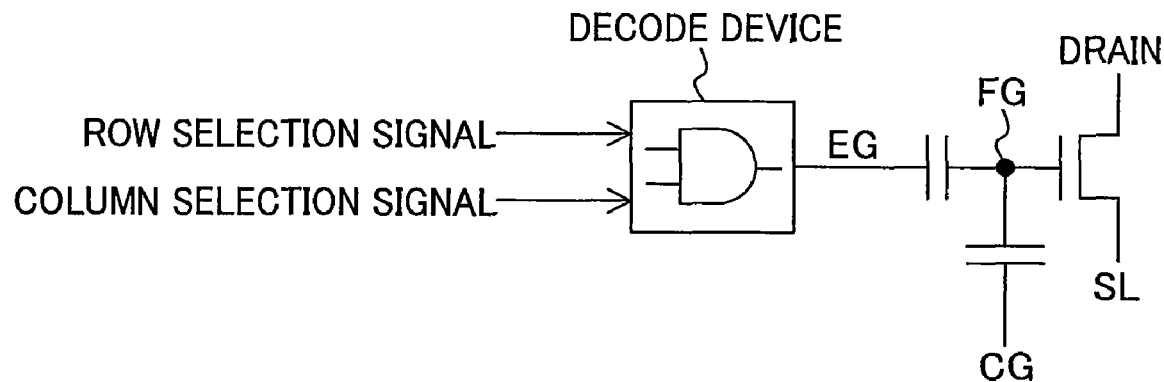
FIG. 21 is a circuit diagram conceptually showing a configuration of the nonvolatile semiconductor memory device in accordance with the present invention.

As discussed above, the significant features of the nonvolatile semiconductor memory device in accordance with the present invention lie in that, as conceptually shown in FIG. 21, a plurality of memory units each including a read device, an erase device, and a decode device, each of which is composed of a MOS transistor, are arranged in arrays, wherein the read device is connected to the erase device, the read device and the erase device share a gate, and the output side of the decode device controlled by a row selection signal and a column selection signal is connected to the erase device.

Figure 22:
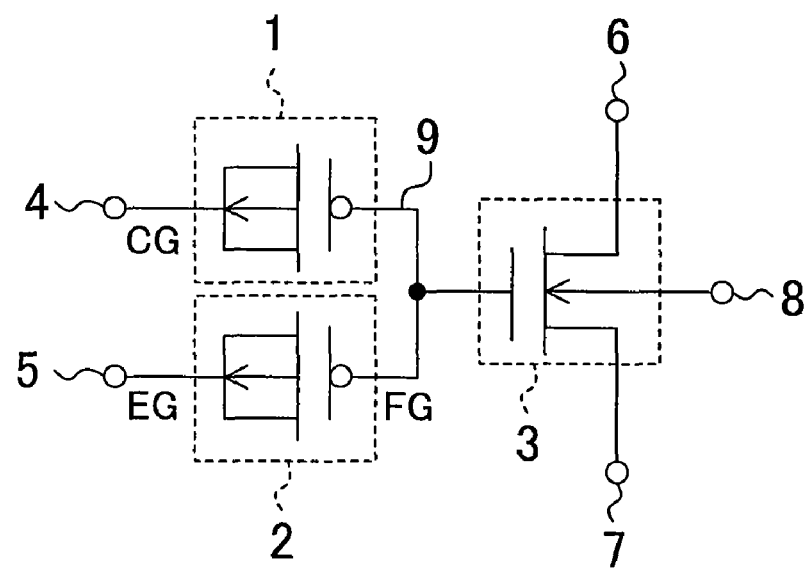
FIG. 22 is a circuit diagram of a conventional nonvolatile memory element.
Figure 23:
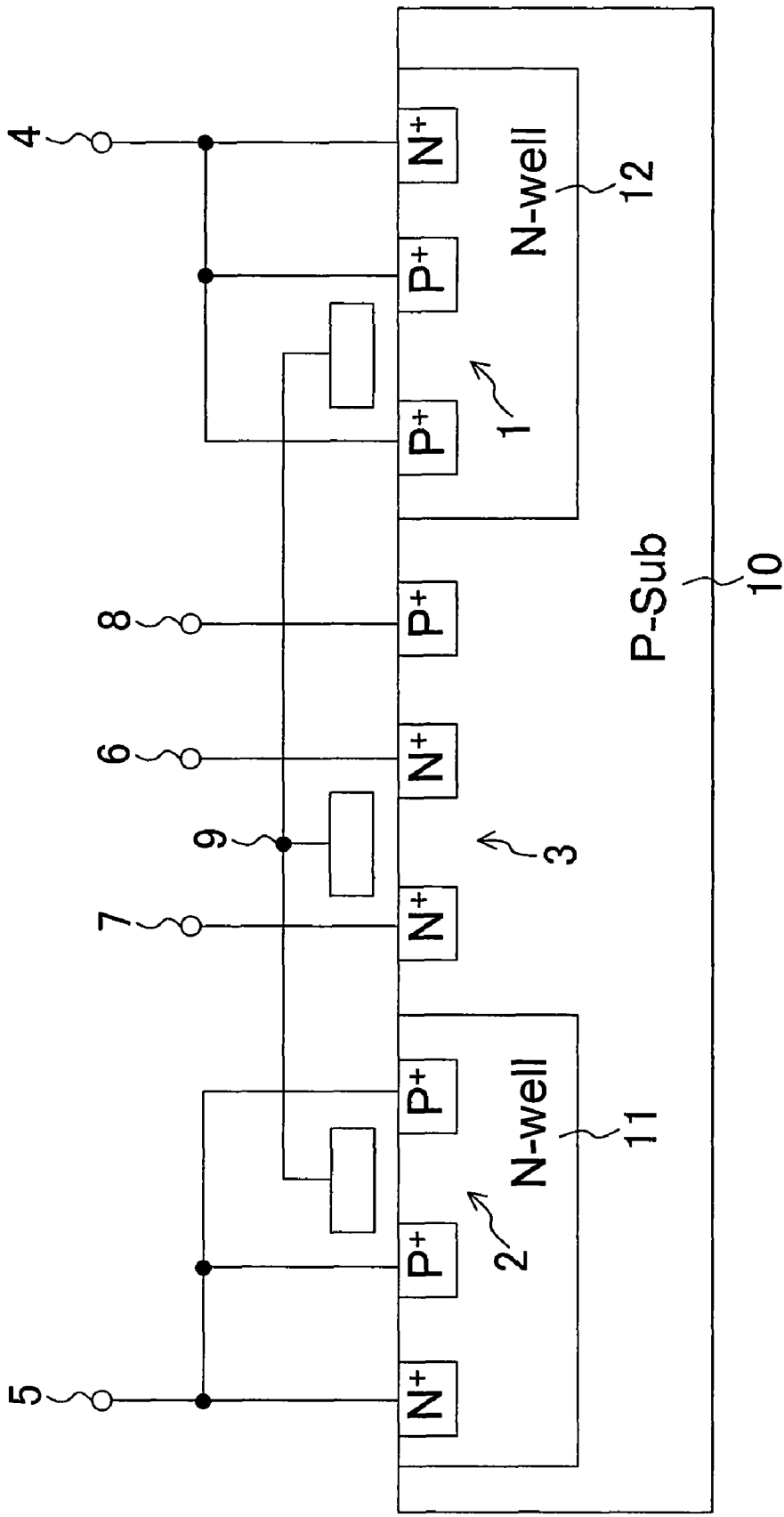
FIG. 23 is a sectional view of the conventional nonvolatile memory element.

The present invention is not limited to the case where the nonvolatile memory element shown in FIG. 5 or FIG. 6 is employed but is applicable to the case where the nonvolatile memory element shown in FIG. 22 or FIG. 23 is employed. In addition, the present invention is applicable to the case where each of the control gate capacitor and the erase gate capacitor is not composed of a MOS transistor.

The nonvolatile semiconductor memory device in accordance with the present invention is a nonvolatile semiconductor memory device capable of being fabricated by the CMOS process and is accordingly useful in application to information implementation for circuit trimming, securing data, and the like.

What is claimed is:

1. A nonvolatile semiconductor memory device comprising a plurality of memory units arranged in array and each including a read device, an erase device, and a decode device, each of which is composed of a MOS transistor,
    wherein in each of the memory units, the read device and the erase device are connected to each other, the read device and the erase device share a gate, and an output side of the decode device, which is controlled by a row selection signal and a column selection signal, is connected to the erase device.

2. The nonvolatile semiconductor memory device of claim 1,
    wherein the column selection signal of the decode device is generated from a program signal and a data signal.

3. The nonvolatile semiconductor memory device of claim 1,
    wherein the column selection signal of the decode device is generated from an address signal, a data signal and a program signal.

4. The nonvolatile semiconductor memory device of claim 1,
    wherein the decode device is composed of a NAND circuit.

5. The nonvolatile semiconductor memory device of claim 1,
    wherein a part under a drain of at least one MOS transistor of the decode device is subjected to well injection.

6. The nonvolatile semiconductor memory device of claim 1, further comprising:
    a capacitance coupling device connected to the gate shared by read device and the erase device in each of the memory units.

7. The nonvolatile semiconductor memory device of claim 1,
    wherein a thickness of a gate oxide film of each MOS transistor composing the respective memory units is substantially equal to a thickness of a gate oxide film of a MOS transistor forming an input/output circuit of an LSI.

* * * * *